United States Patent
Oikawa et al.

(10) Patent No.: US 9,773,964 B2
(45) Date of Patent: Sep. 26, 2017

(54) ELECTRONIC COMPONENT

(71) Applicant: Kyocera Corporation, Kyoto (JP)

(72) Inventors: Akira Oikawa, Kyoto (JP); Eiji Sakata, Kyoto (JP)

(73) Assignee: Kyocera Corporation, Kyoto (JP)

( * ) Notice: Subject to any disclaimer, the term of this patent is extended or adjusted under 35 U.S.C. 154(b) by 645 days.

(21) Appl. No.: 14/369,677

(22) PCT Filed: Dec. 26, 2012

(86) PCT No.: PCT/JP2012/083685
§ 371 (c)(1),
(2) Date: Jun. 27, 2014

(87) PCT Pub. No.: WO2013/099963
PCT Pub. Date: Jul. 4, 2013

(65) Prior Publication Data
US 2014/0361663 A1    Dec. 11, 2014

(30) Foreign Application Priority Data

Dec. 27, 2011 (JP) .................................. 2011-286052
Jan. 20, 2012 (JP) .................................. 2012-010173

(51) Int. Cl.
*H01L 41/053* (2006.01)
*H03H 9/10* (2006.01)
(Continued)

(52) U.S. Cl.
CPC .......... *H01L 41/053* (2013.01); *H01L 41/047* (2013.01); *H03H 9/1064* (2013.01);
(Continued)

(58) Field of Classification Search
CPC ........ H03H 3/02; H01L 41/047; H01L 41/053
(Continued)

(56) References Cited

U.S. PATENT DOCUMENTS

| 7,211,935 B1* | 5/2007 | Houk ................... H01L 41/313 310/348 |
| 2004/0251777 A1 | 12/2004 | Yamamoto et al. |
| 2012/0091857 A1* | 4/2012 | Ikeji ..................... H01L 41/053 310/323.17 |
| 2012/0181898 A1* | 7/2012 | Hatakeyama ............ H03H 3/02 310/313 B |

(Continued)

FOREIGN PATENT DOCUMENTS

| JP | 05-55303 A | 3/1993 |
| JP | 2003-168942 A | 6/2003 |

(Continued)

OTHER PUBLICATIONS

International Search Report dated May 14, 2013, issued in counterpart International application No. PCT/JP2012/083685.

*Primary Examiner* — Thomas Dougherty
(74) *Attorney, Agent, or Firm* — Procopio Cory Hargreaves and Savitch LLP

(57) ABSTRACT

An electronic component has a support member, an SAW element which is mounted on the support member with a space S therebetween and which has a facing surface which faces the support member, and a resin portion which covers the SAW element and which is provided so as to seal the space S. The SAW element has a piezoelectric substrate, an IDT provided on the facing surface of the piezoelectric board, an wiring (an outer wiring) which is provided on the facing surface of the piezoelectric board and extends from the IDT toward the periphery side of the piezoelectric board, and a dam member which is adjacent to a lateral edge portion of the wiring and which is provided locally relative to the circumferential direction which surrounds the IDT.

20 Claims, 15 Drawing Sheets

(51) Int. Cl.
  *H01L 41/047* (2006.01)
  *H05K 1/18* (2006.01)
  *H01L 23/31* (2006.01)
  *H03H 9/00* (2006.01)
  *H03H 9/05* (2006.01)

(52) U.S. Cl.
  CPC ........... *H03H 9/1085* (2013.01); *H05K 1/185* (2013.01); *H01L 23/3121* (2013.01); *H01L 2924/0002* (2013.01); *H03H 9/0038* (2013.01); *H03H 9/059* (2013.01); *H05K 2201/1009* (2013.01); *H05K 2201/10196* (2013.01)

(58) Field of Classification Search
  USPC ........................................ 310/340, 344, 348
  See application file for complete search history.

(56) References Cited

U.S. PATENT DOCUMENTS

| | | | |
|---|---|---|---|
| 2014/0042870 A1* | 2/2014 | Ohashi | H03H 3/08 310/313 R |
| 2014/0175943 A1* | 6/2014 | Iwamura | H03H 3/02 310/313 R |

FOREIGN PATENT DOCUMENTS

| | | | | |
|---|---|---|---|---|
| JP | 2004-56295 A | 2/2004 | | |
| JP | 2004-56296 A | 2/2004 | | |
| JP | 2004-64732 A | 2/2004 | | |
| JP | 2005-130343 | * 5/2005 | ............... | H03H 3/08 |
| JP | 2005-130343 A | 5/2005 | | |
| JP | 2006-279484 A | 10/2006 | | |

\* cited by examiner

ELECTRONIC COMPONENT

TECHNICAL FIELD

The present invention relates to an electronic component including an electronic element such as a surface acoustic wave (SAW) element or a film bulk acoustic resonator (FBAR).

BACKGROUND ART

In electronic components which have a support member, an electronic element mounted on the support member, and a sealing member covering the electronic element provided therein, there are known components which prevent the sealing resin from flowing into the facing space between the support member and the electronic element. For example, in Patent Literature 1, a ring-shaped dam surrounding the facing space is formed on either of the facing surfaces of the electronic element and the support member which face each other to thereby prevent the sealing resin from flowing into the facing space. Due to this, the functional member (SAW resonator etc.) which is exposed in the facing space is kept from being covered by the resin portion and a drop in the electrical characteristics is suppressed. Note that, an electronic component not provided with such a dam is known as well (Patent Literature 2).

CITATIONS LIST

Patent Literature

Patent Literature 1: Japanese Patent Publication No. 05-55303A
Patent Literature 2: Japanese Patent Publication No. 2006-279484A

SUMMARY OF INVENTION

Technical Problem

In the art of Patent Literature 1, however, for example the dam must be provided in a ring shape, therefore the inconvenience arises that space-saving at the facing surfaces of the electronic component etc. is obstructed.

An object of the present invention is to provide an electronic component which is capable of suitably controlling the flow of the sealing resin.

Solution to Problem

An electronic component according to one aspect of the present invention has a support member, an electronic element which is mounted on the support member with a space therebetween and which has a facing surface which faces the support member, and a sealing resin which covers the electronic element and which is provided so as to seal the space. The electronic element has an element board, a functional member provided on the facing surface of the element board, a first wiring which is provided on the facing surface of the element board and extends from the functional member toward the periphery side of the element board, and a flow suppression part against a liquid-state resin, which includes a portion positioned at least at one of an edge of the first wiring, an edge of the functional member, and a position adjacent to these edges and which is provided locally relative to the circumferential direction which surrounds the functional member.

Advantageous Effects of Invention

According to the above configuration, the flow of the sealing resin can be suitably controlled.

BRIEF DESCRIPTION OF DRAWINGS

FIG. 15A is an enlarged view of a region XVa in FIG. 14, while

DESCRIPTION OF EMBODIMENT

Below, electronic components according to embodiments of the present invention will be explained with reference to the drawings. Note that, the drawings used in the following explanation are schematic ones. Dimensions, ratios, etc. on the drawings do not always match the actual ones.

Further, in the explanation of the embodiments etc., parts of the configurations which are the same as or similar to the already explained configurations will be assigned the same notations, and explanations will sometimes be omitted.

<First Embodiment>

Figure 1A:
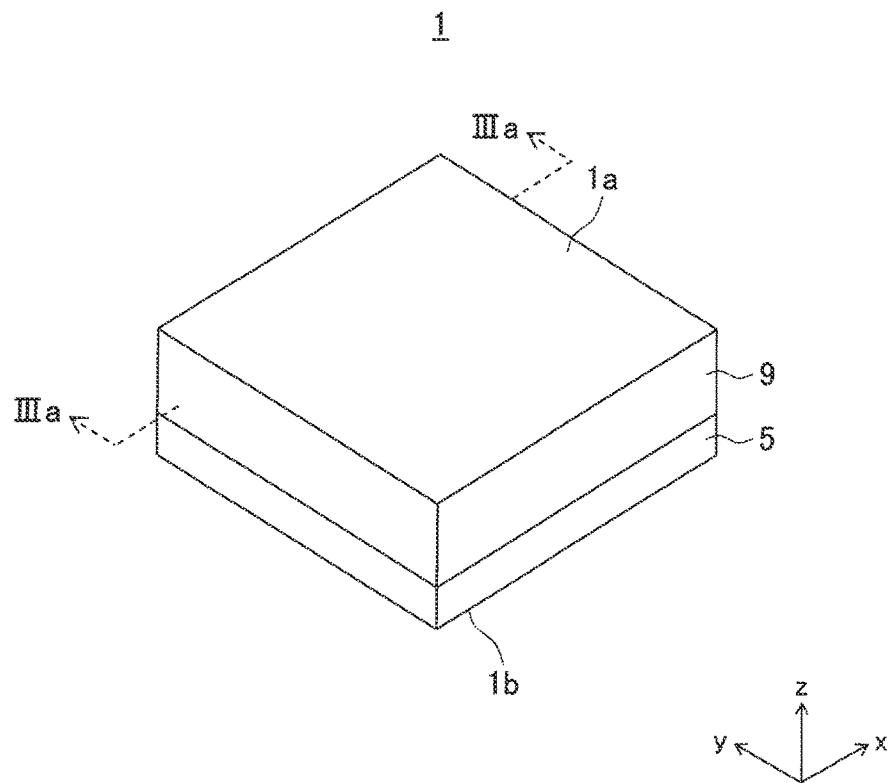
FIGS. 1A and FIG. 1B are perspective views which show an appearance of an electronic component according to a first embodiment of the present invention.
Figure 1B:
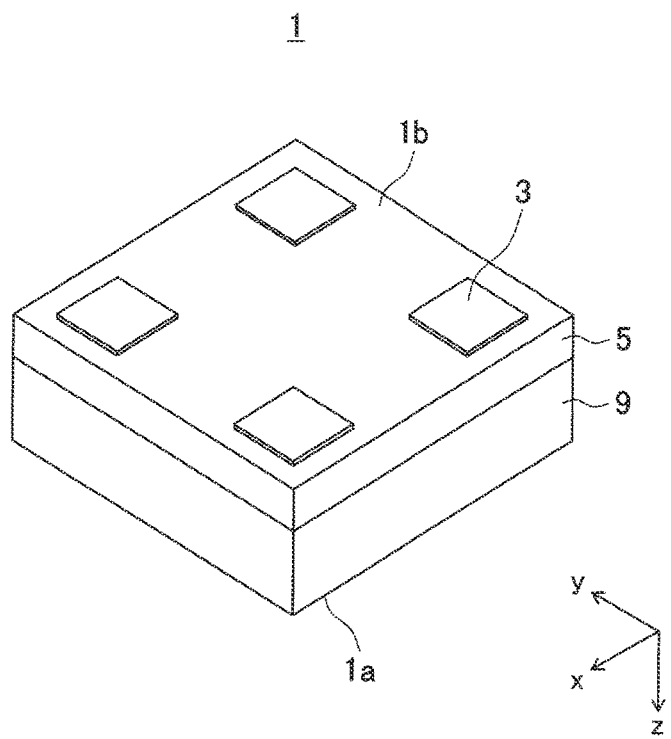

FIG. 1A is a perspective view seen from an upper surface 1a side which shows an appearance of an electronic component 1 according to a first embodiment of the present invention, while FIG. 1B is a perspective view seen from a lower surface 1b side which shows an appearance of the electronic component 1.

Note that, in the electronic component 1, any direction may be defined as upward or downward. However, for convenience, an orthogonal coordinate system xyz is defined, and use is made of a term "upper surface" or "lower surface" where the positive side of the z-direction is the upper part.

The electronic component 1 is for example formed roughly in a box shape. At its lower surface 1b, a plurality of external terminals 3 of suitable shape and suitable number are exposed. The size of the electronic component 1 may be made a suitable size. However, for example, the length of one side is 1 mm to several mm.

The electronic component 1 is arranged with its lower surface 1b facing a not shown mounting board and is mounted on the mounting board by bonding pads which are provided on the mounting board and the plurality of external terminals 3 through solder bumps etc. Further, the electronic component 1 for example receives as input a signal through any of the plurality of external terminals 3, applies predetermined processing to the input signal, and outputs the result from any of the plurality of external terminals 3.

Note that, the number of the plurality of external terminals 3 and their positions and roles may be suitably set in accordance with the configuration etc. of the inside of the electronic component 1. In the present embodiment, a case where four external terminals 3 are provided at four corners of the lower surface 1b is exemplified.

Figure 2:
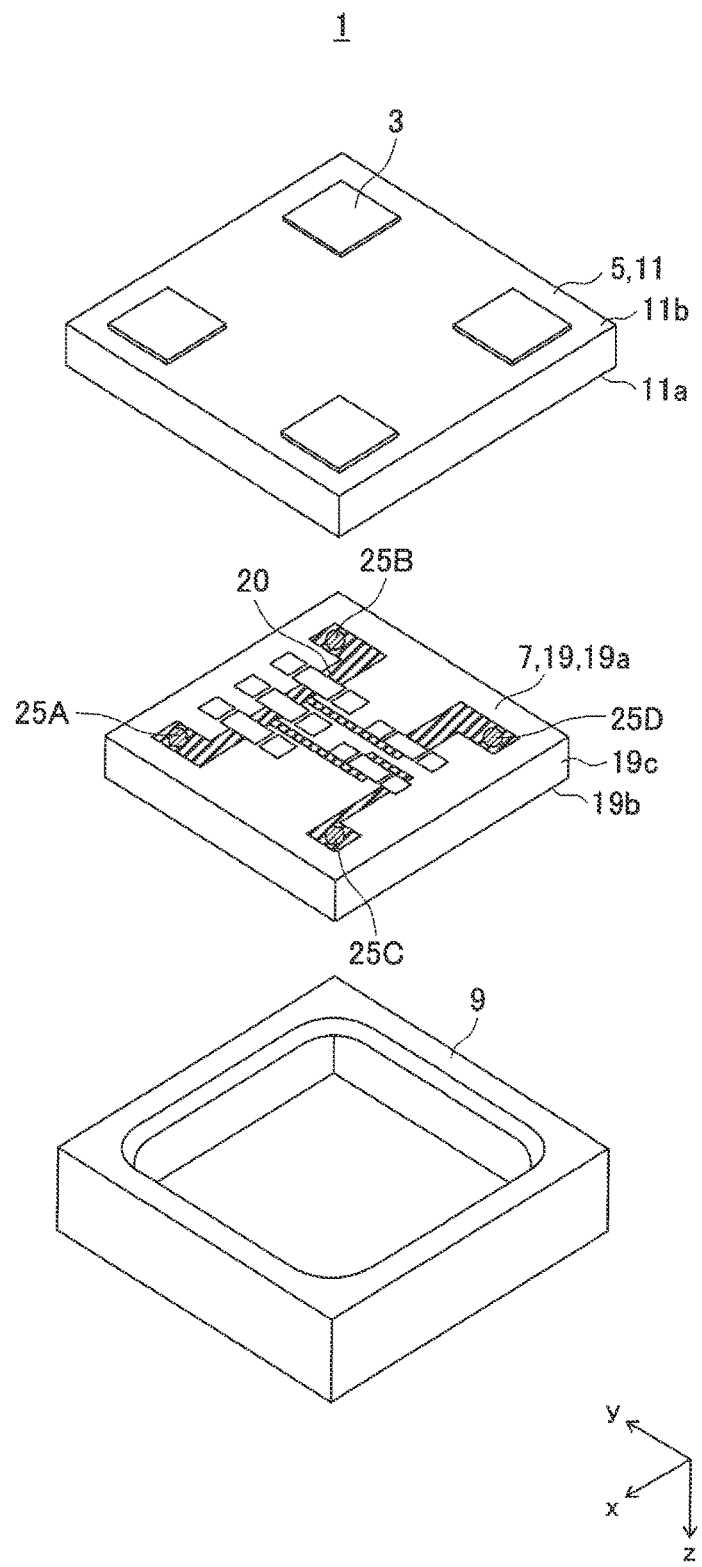
FIG. 2 A disassembled perspective view of the electronic component in FIG. 1.
Figure 3A:
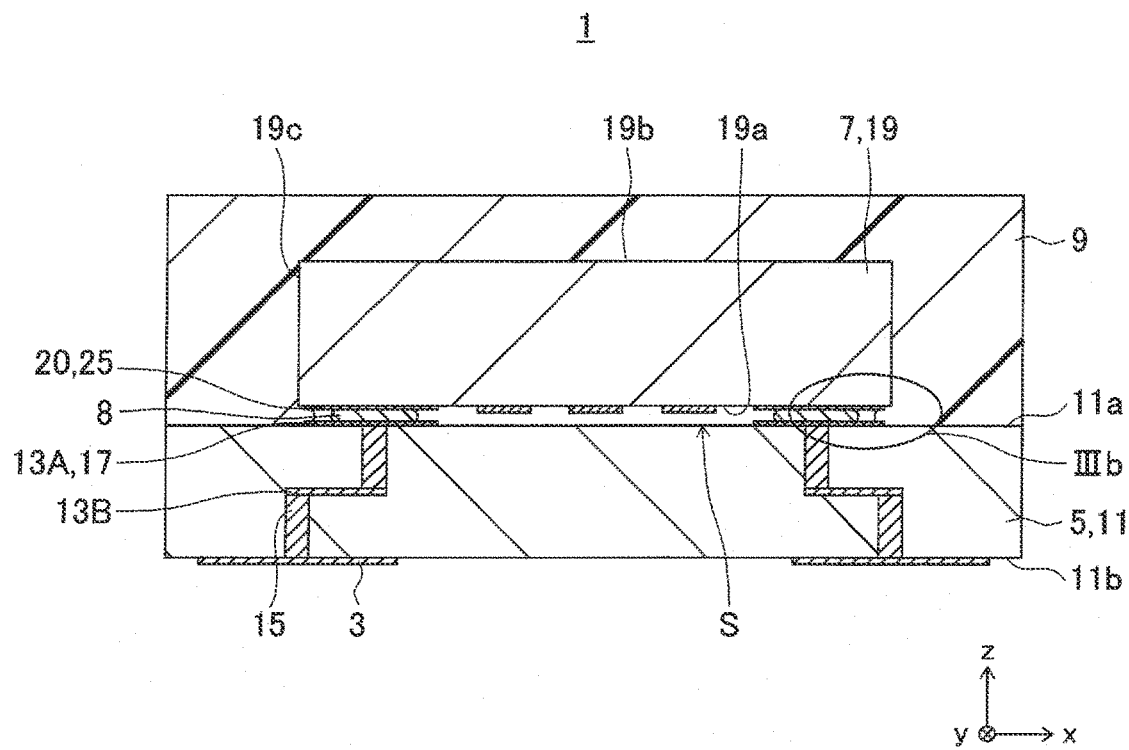
FIG. 3A is a cross-sectional view taken along a line IIIa-IIIa in FIG. 1A.

FIG. 2 is a disassembled perspective view of the electronic component 1. FIG. 3A is a cross-sectional view taken along a line in FIG. 1A. Note that, in actuality, the electronic component 1 cannot be disassembled as in FIG. 2 without breaking some members.

The electronic component 1 has a support member 5, a SAW element 7 which is mounted on the support member 5, bumps 8 (FIG. 3A) which are interposed between the support member 5 and the SAW element 7, and a resin portion 9 for sealing the SAW element 7.

The support member 5 is for example configured by a rigid type printed wiring board and has an insulating base member 11, an upper surface conductive layer 13A (FIG. 3A) which is formed on an upper surface 11a of the insulating base member 11, an internal conductive layer 13B (FIG. 3A) which is formed inside the insulating base member 11 so as to be parallel to the upper surface 11a, via conductors 15 (FIG. 3A) which pass through all or part of the insulating base member 11 in the vertical direction, and the already explained external terminals 3 which are formed on a lower surface 11b of the insulating base member 11. Note that, a support member 5 which is not provided with an internal conductive layer 13b may be employed as well.

The insulating base member 11 is for example formed in a roughly thin box shape. Further, the insulating base member 11 is for example formed containing a resin, ceramic, and/or amorphous inorganic material. The insulating base member 11 may be one comprised of a single material or one comprised of a composite material like a board comprised of a base material impregnated with a resin.

The upper surface conductive layer 13A includes board pads 17 (FIG. 3A) for mounting the SAW element 7 on the support member 5. The via conductors 15 and internal conductive layer 13B include wirings for connecting the board pads 17 and the external terminals 3. Note that, the upper surface conductive layer 13A, internal conductive layer 13B, and via conductors 15 may include inductors, capacitors, or circuits for running suitable processing. The upper surface conductive layer 13A, internal conductive layer 13B, via conductors 15, and external terminals 3 are configured by for example metal such as Cu.

The SAW element 7 has a piezoelectric substrate 19 and an element conductive layer 20 which is provided on a lower surface 19a of the piezoelectric substrate 19 (facing surface facing the support member 5). Note that, the SAW element 7, other than these, may have suitable members such as an electrode and/or a protective layer which cover an upper surface 19b of the piezoelectric substrate 19.

The piezoelectric substrate 19 is for example formed in a roughly thin box shape. The size of the piezoelectric substrate 19 when viewed as a plane is smaller than the size of the support member 5 when viewed as a plane. The piezoelectric substrate 19 is for example comprised of a substrate of a single crystal having a piezoelectric property such as a lithium tantalate single crystal or a lithium niobate single crystal.

The element conductive layer 20 includes element pads 25A to 25D (hereinafter, A to D will be sometimes omitted). Note that, the rest of the configuration (patterns) included in the element conductive layer 20 will be explained later.

Bumps 8 are interposed between the element pads 25 and the board pads 17 and join these pads. The bumps 8 are comprised of solder. The solder may be a solder which uses lead such as a Pb—Sn alloy solder or may be a lead-free solder such as an Au—Sn alloy solder, Au—Ge alloy solder, Sn—Ag alloy solder, and Sn—Cu alloy solder. Note that, the bumps 8 may be formed by a conductive binder as well.

By interposition of the bumps 8 between the element pads 25 and the board pads 17, a gap (space S, FIG. 3A) is formed between the upper surface 11a of the insulating base member 11 and the lower surface 19a of the piezoelectric substrate 19. Due to this, propagation of the SAW which will be explained later is facilitated.

The resin portion 9 is for example provided so as to cover the SAW element 7 on the support member 5. That is, the resin portion 9 abuts against the upper surface 19b and side surfaces 19c of the SAW element 7 and against a portion in the upper surface 11a of the support member 5 which is located on the periphery of the SAW element 7. At least a portion, preferably all, of these abutting portions are adhered.

The resin portion 9 is for example formed so that its outer shape roughly forms a box shape. The shape and size of that when viewed as a plane are for example the same as the planar shape of the support member 5, and the side surfaces of the resin portion 9 form flush surfaces together with the side surfaces of the support member 5. The thickness of the resin portion 9 on the SAW element 7 may be made a suitable magnitude from various viewpoints such as the viewpoint of protection of the SAW element 7.

The resin portion 9 is comprised of a resin. The resin is preferably a thermosetting resin, while the thermosetting resin is for example an epoxy resin or phenol resin. In the resin, a filler made of insulating particles formed by a material having a lower thermal expansion coefficient than that of the resin may be mixed. The material of the insulating particles is for example silica, alumina, phenol, polyethylene, glass fiber, or graphite filler.

The resin portion 9 is not filled in the space S, but the space S is sealed by the resin portion 9. The interior of the space S may be evacuated or gas such as air may be sealed in it. In the case where a gas is sealed in it, the pressure may be higher than atmospheric pressure, equal to the latter, or lower than the atmospheric pressure when the temperature in the space S is equal to the temperature of the atmospheric air.

Figure 3B:
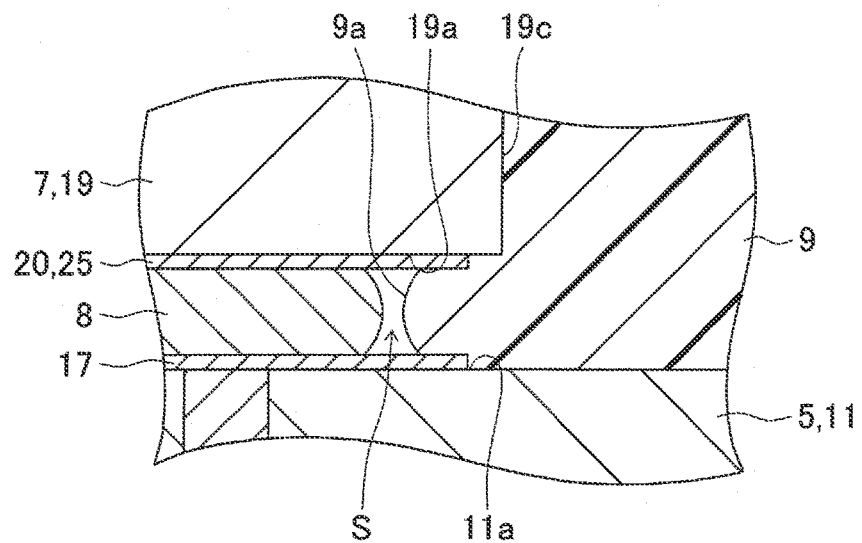
FIG. 3B is an enlarged view of a region IIIb in FIG. 3A.

FIG. 3B is an enlarged view of a region IIIb in FIG. 3A.

The resin portion 9 has an inner wall surface 9a which surrounds the space S. The inner wall surface 9a is for example positioned on an inner side from the side surface 19c of the piezoelectric substrate 19. Note that, the inner wall surface 9a may be concave, convex, or flat. Further, the inner wall surface 9a may abut or not abut against the bumps 8.

Figure 4:
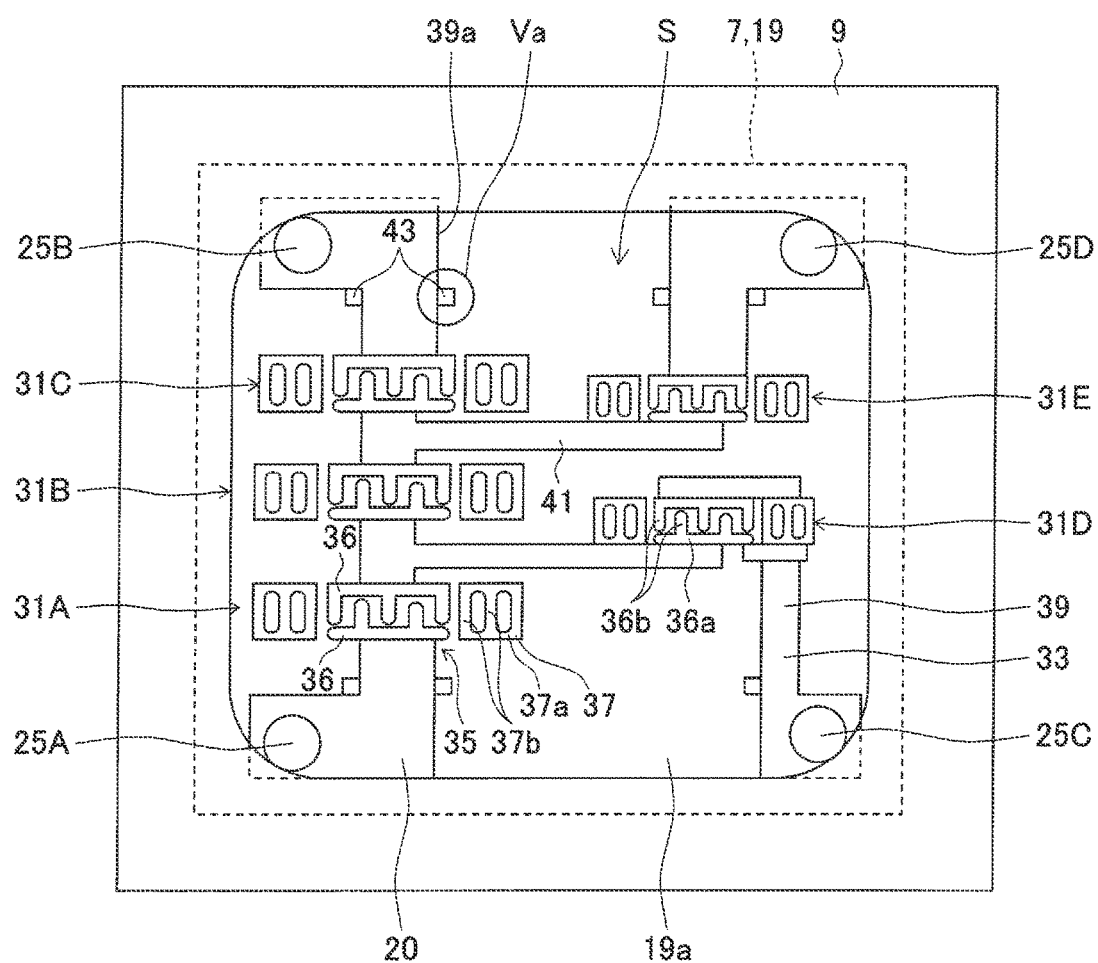
FIG. 4 A plan view which shows a part of the electronic component detached.

FIG. 4 is a plan view of the electronic component 1 when viewed from the lower surface side which is shown with the support member 5 detached.

The element conductive layer 20 includes for example one or a plurality of (in the present embodiment, a plurality of) SAW resonators 31A to 31E (hereinafter, A to E will be sometimes omitted), and the wirings 33 which are connected to the plurality of SAW resonators 31. Note that, the wirings 33 may be grasped as ones including the element pads 25 as well.

The SAW resonators 31 may be provided in suitable configurations, number, and arrangement in accordance with various objects. The present embodiment exemplifies a case where a ladder-type SAW filter is configured by the plurality of SAW resonators 31.

Specifically, the SAW resonators 31A to 31C are connected in series between the element pads 25A and 25B. The SAW resonators 31D and 31E are connected in parallel to them. That is, each of the SAW resonators 31D and 31E is arranged between each two among the SAW resonators 31A to 31C and each of the element pads 25C and 25D.

When a signal is input to the element pad 25A, the ladder-type SAW filter configured by the plurality of SAW resonators 31A to 31E filters that signal and outputs the result to the element pad 25B. Note that, the element pads 25C and 25D are connected to the reference potential.

Each SAW resonator 31 is for example a 1-port SAW resonator and has an IDT 35 and two reflectors 37 which sandwich the IDT 35 therebetween.

The IDT 35 has a pair of comb-shaped electrodes 36 which are arranged so as to mesh with each other. Each comb-shaped electrode 36 has a bus bar 36a formed with a long length and a plurality of electrode fingers 36b which extend from the bus bar 36a in a direction perpendicular to the longitudinal direction of the bus bar 36a. The pitch of the plurality of electrode fingers 36b is roughly constant.

The reflector 37 has a pair of bus bars 37a which are formed with long lengths and are arranged by making their long sides face each other and has a plurality of electrode fingers 37b which extend between the pair of bus bars 37a. The pitch of the plurality of electrode fingers 37b is roughly constant and roughly the same as the pitch of the plurality of electrode fingers 36b of the IDT 35. The interval between the IDT 35 and the reflector 37 is roughly the same as the pitch of the electrode fingers 36b and 37b.

An electrical signal which is input to one bus bar 36a of the pair of comb-shaped electrodes 36 is converted to a SAW which propagates in a direction perpendicular to the plurality of electrode fingers 36b. This SAW is converted to an electrical signal again and is output from the other bus bar 36a of the pair of comb-shaped electrodes 36. In this process, the electrical signal is attenuated in frequency component out of the passband. The passband corresponds to the frequency band of the SAW where the pitch of the plurality of electrode fingers 36b is roughly a half-wavelength.

The plurality of SAW resonators 31 are packed in the space S (not covered by the resin portion 9). Accordingly, in the SAW resonators 31, the propagation of SAW (vibration of the piezoelectric substrate 19) is facilitated.

The wirings 33 for example have outer wirings 39 for connecting the plurality of SAW resonators 31 and the element pads 25 and intermediate wirings 41 for connecting the SAW resonators 31 to each other (or the comb-shaped electrodes 36 and reflectors 37).

The outer wirings 39 basically connect the bus bars 36a and the element pads 25. Further, the intermediate wirings 41 basically connect the bus bars 36a of mutually different SAW resonators 31 to each other. Note that, in the SAW resonator 31D, the bus bar 36a which becomes the reference potential side and one reflector 37 are connected by an intermediate wiring 41, and that reflector 37 and the element pad 25C are connected by an outer wiring 39.

The outer wirings 39 extend from the SAW resonators 31 toward the periphery side of the piezoelectric substrate 19. Further, the portions of the outer wirings 39 which are positioned at the outer circumferential side from the element pads 25 are positioned on the outer side from the space S and contacts the resin portion 9.

Note that, the intermediate wirings 41 connect the SAW resonators 31 which are packed in the space S to each other. Therefore, basically they do not contact the resin portion 9. Note, for example, the plurality of SAW resonators 31 are suitably arranged so as to reduce the size of the SAW element 7. As a result, portions of the intermediate wirings 41 may be positioned at the outside of the space S and contact the resin portion 9 as well.

The outer wirings 39 and intermediate wirings 41 may extend in a straight shape or may extend in a curved shape or may be bent. Further, they may extend with constant widths, may gradually vary in widths, or may stepwisely vary in widths. In the present embodiment, the outer wirings 39 linearly extend from the SAW resonators 31 with a constant width, then bend and become broader.

The parts of the element conductive layer 20 (SAW resonators 31, wirings 33, and element pads 25) are for example formed by the same materials as each other. Note that, in FIG. 4 etc., for convenience of explanation, border lines among them are clearly indicated. However, in actuality, a portion of them may be comprised of another material as well. The element conductive layer 20 is for example comprised of metal such as Al—Cu alloy. Note that, in the element pads 25, for the purpose of improvement of bonding with the bumps 8 and so on, suitable plating layers of nickel, gold, and so on may be formed on the surface. The thickness of the element conductive layer 20 is for example 100 nm to 300 nm.

On the lower surface 19a of the SAW element 7, in addition to the above, provision is made of a plurality of dam members 43 for controlling (specifically suppressing) the flow of liquid-state resin which forms the resin portion 9 in the process of manufacturing the electronic component 1 and so on.

The dam members 43 are provided adjacent to lateral edge portions 39a of the outer wirings 39 (the edge portions which is lateral with respect to the extension direction of the outer wirings 39). Further, the dam members 43 are scattered over the lower surface 19a of the SAW element 7. That is, the dam members 43 are provided partially (locally) relative to the circumferential direction (or circumference) surrounding one or a plurality of SAW resonators 31, but do not surround one or a plurality of SAW resonators 31. Further, the dam members 43 do not cross the wirings 33. Further, the dam members 43 are not positioned in the propagation direction of the SAW (y-direction) with respect to the SAW resonators 31 (in more detail, electrode fingers).

Figure 5A:
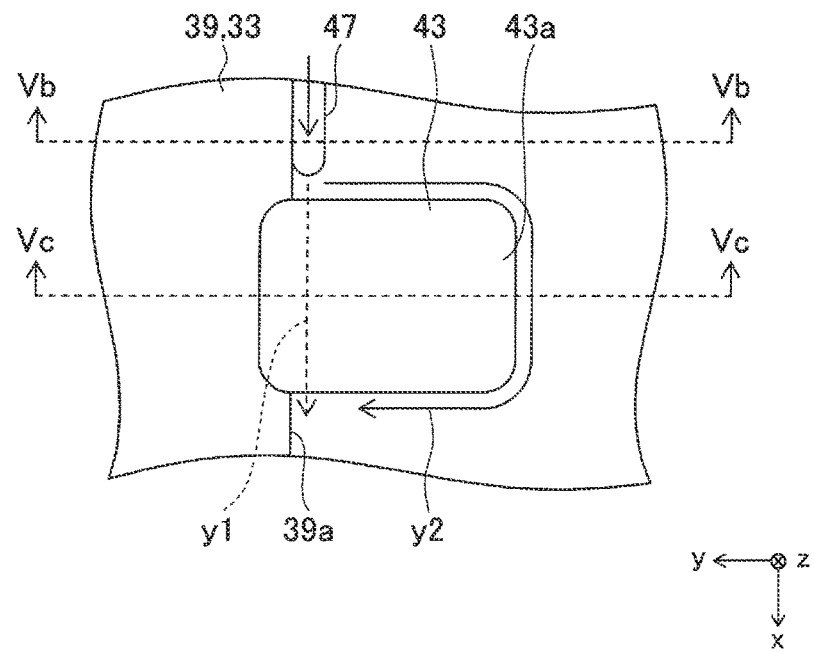
FIG. 5A is an enlarged view of a region Va in FIG. 4.
Figure 5B:
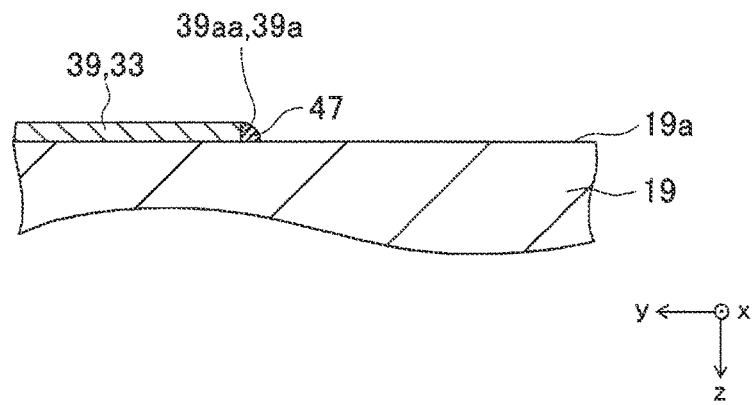
FIG. 5B is a cross-sectional view taken along a line Vb-Vb in FIG. 5A.
Figure 5C:
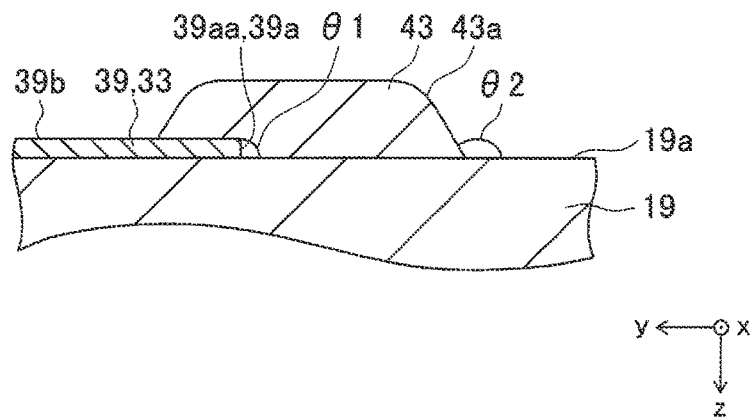
FIG. 5C is a cross-sectional view taken along a line Vc-Vc in FIG. 5A.

FIG. 5A is an enlarged view of a region Va in FIG. 4. FIG. 5B is a cross-sectional view taken along a line Vb-Vb in FIG. 5A. FIG. 5C is a cross-sectional view taken along a line Vc-Vc in FIG. 5A.

Each dam member 43 abuts against a side surface 39aa at a lateral edge portion 39a of an outer wiring 39. The dam member 43 may partially overlap the outer wiring 39 at the lateral edge portion 39a (may cover the upper surface 39b of the outer wiring 39) or may not overlap it. The present embodiment exemplifies the case where they overlap each other. Further, the thickness of the dam member 43 can be suitably set. For example, this thickness is larger than the thickness of the outer wiring 39. For example, in contrast to the thickness of the outer wiring 39 which is 100 nm to 300 nm, the thickness of the dam member 43 is 0.5 to 3 μm.

The side surface 43a of the dam member 43 which is on the opposite side to the outer wiring 39 becomes an inclined surface. An angle θ2 of a groove formed by the side surface 43a and the lower surface 19a is larger than an angle θ1 of a groove formed by the side surface 39aa of the outer wiring 39 and the lower surface 19a. Note that, although not particularly shown, also the front surface or rear surface (surface facing the x-direction) of the dam member 43 may be an inclined surface in the same way as the side surface 43a.

Each dam member 43 may be formed by an insulating material or formed by a conductive material. Note, in the case where the dam member 43 abuts against an outer wiring 39 as in the present embodiment, from a viewpoint of making the impedance etc. of the element conductive layer 20 match with the design value with a high accuracy, preferably the dam member 43 is formed by an insulating material. The insulating material is for example a resin or ceramic. The resin is preferably a photosensitive resin from the viewpoint of the ease of patterning. The photosensitive resin is for example a polyimide.

Figure 6A:
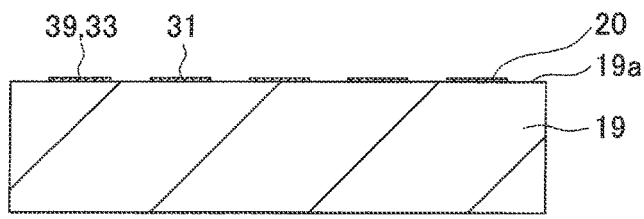
FIG. 6A to FIG. 6E are cross-sectional views for explaining a method for producing the electronic component in FIG. 1.
Figure 6B:
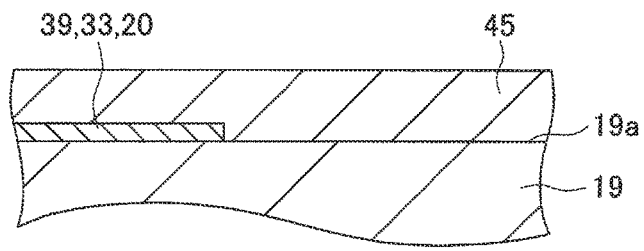
Figure 6C:
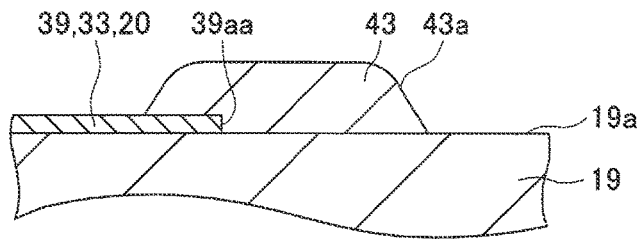
Figure 6D:
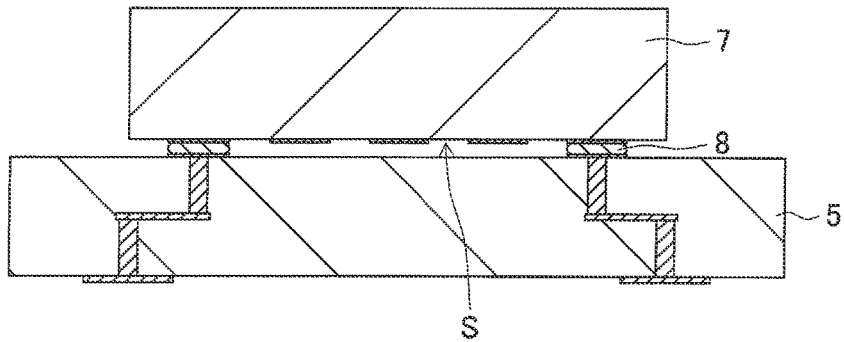
Figure 6E:
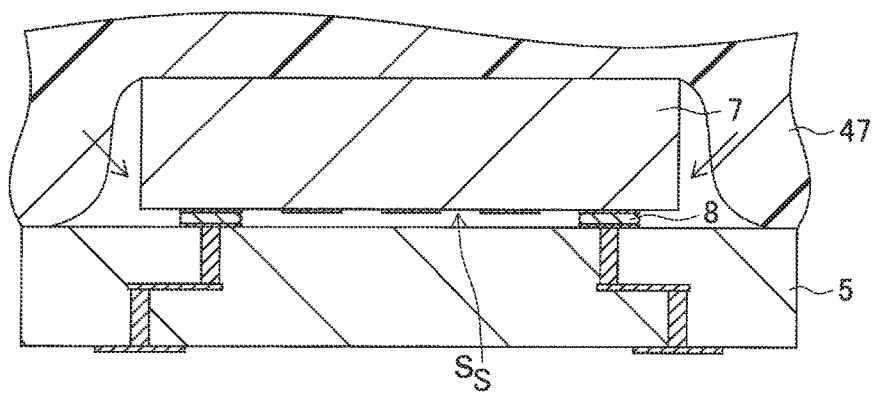

FIG. 6A to FIG. 6E are views for explaining a method for producing the electronic component 1. FIG. 6A, FIG. 6D, and FIG. 6E are cross-sectional views corresponding to FIG. 3A, and FIG. 6B and FIG. 6C are cross-sectional views corresponding to FIG. 5C. The manufacturing process proceeds from FIG. 6A to FIG. 6E in that order.

First, as shown in FIG. 6A, the element conductive layer 20 is formed on the lower surface 19a of the piezoelectric substrate 19. Note that, this process is carried out on a mother board which is later divided into the piezoelectric substrates 19. However, FIG. 6A shows only a portion corresponding to one electronic component 1.

In formation of the element conductive layer 20, specifically, first, a metal layer on the lower surface 19a is formed by a thin film forming method such as a sputtering process, a vapor deposition process or a CVD (chemical vapor deposition). Next, the metal layer is patterned by a photolithography process or the like. By patterning, SAW resonators 31, wirings 33, and element pads 25 are formed.

After the formation of the element conductive layer 20, as shown in FIG. 6B, an insulating layer 45 which becomes the dam members 43 is formed. The insulating layer 45 is for example formed over the entire surface of the lower surface 19a of the piezoelectric substrate 19 and covers the element conductive layer 20 as well. The insulating layer 45 is for example formed by the thin film forming method such as the vapor deposition process or the CVD.

After the formation of the insulating layer 45, as shown in FIG. 6C, it is patterned by photolithography or the like to form the dam members 43. At this time, for example, if using a positive type photosensitive material as the material of the insulating layer 45, the nearer to the lower surface 19a, the more insufficient the irradiation of light due to scattering of light. As a result, the side surface 43a of each dam member 43 can be inclined more than the side surface 39aa of the outer wiring 39. Alternatively, by expanding (in the case of the negative type) or reducing (in the case of the positive type) the light passing through the photo-mask by a suitable optical system and making the outer circumferential surface of the light inclined, the side surface 43a can be inclined.

After that, although not particularly shown, the mother board is diced to separate it into the individual SAW elements 7.

Next, as shown in FIG. 6D, each SAW element 7 is mounted on the support member 5. Note that, at this point of time, for example, the support member 5 has not yet been divided, but remains in the state of a mother board. However, it may be separated into individual pieces as well.

Specifically, first, the support member 5 is prepared. The method of production of the support member 5 may be the same as the method of production of a general printed circuit board. Next, bumps 8 are provided on the support member 5 by screen printing or another suitable method. Note that, the bumps 8 may be provided on the SAW element 7 before separation of the SAW element 7 or the like as well. Further, the SAW element 7 is arranged on the support member 5 through the bumps 8, then a reflow furnace or the like is used to heat and melt bumps 8 then these are cooled.

When the SAW element 7 is mounted on the support member 5, as shown in FIG. 6E, a liquid-state resin 47 which becomes the resin portion 9 is supplied. The resin 47 is for example supplied by screen printing. At this time, for example, by setting the viscosity of the resin 47 high, setting the pressure to be given to the resin 47 low, or setting the height of the space S low, inflow of the resin 47 to the space S can be suppressed. As the method of raising the viscosity, there can be mentioned selecting a suitable composition of the resin 47, increasing the content of a curing promoter in the resin 47, lowering the curing temperature of the resin 47, and so on.

In this way, in the present embodiment, basically the flow of the resin 47 into the space S is suppressed by utilizing the resistance force caused by the viscosity of the liquid-state resin 47 which becomes the resin portion 9. Note that, in a case where the surroundings of the SAW element 7 are not reduced in pressure when supplying the resin 47, the air in the space S can be utilized as well. Further, the bumps 8 contribute to the suppression of the flow of the resin 47 as well.

Note, as shown in FIG. 5A and FIG. 5B, a portion of the resin 47 is likely to flow to the space S along the lateral edge portion 39a of the outer wiring 39. This can be considered to occur due to capillary pressure generated in the groove formed by the side surface 39aa of the outer wiring 39 and the lower surface 19a of the piezoelectric substrate 19.

However, the dam member 43 is provided adjacent to the lateral edge portion 39a. Due to that, the flow of the resin 47 along the outer wiring 39 is dammed up. From another viewpoint, the route over which the resin 47 flows is changed from the route indicated by an arrow y1 to the route indicated by an arrow y2 which is longer than the former route. As a result, it is suppressed that the resin 47 reaches the SAW resonator 31. Consequently, a drop in the electrical characteristic of the SAW resonator 31 due to the resin 47 is suppressed.

After that, the resin 47 is heated and cured. Further, it is diced together with the mother board configured by the plurality of the support members 5, whereby the individual electronic components 1 are separated into.

As described above, in the present embodiment, the electronic component 1 has the support member 5, the SAW element 7 which is mounted on the support member 5 through the space S, and the resin portion 9 which covers the SAW element 7 and is provided so as to seal the space S. The SAW element 7 has the piezoelectric substrate 19, the IDT 35 provided on the lower surface 19*a* of the piezoelectric substrate 19, the wirings 33 (outer wirings 39) which are provided on the lower surface 19*a* of the piezoelectric substrate 19 and extend from the IDT 35 toward the periphery side of the piezoelectric substrate 19, and the dam members 43 which are adjacent to the lateral edge portions 39*a* of the wirings 33 and is provided partially relative to the circumferential direction surrounding the IDT 35.

Accordingly, as explained with reference to FIG. 5, a member for suppressing flow is provided in a "pin point" manner at each position where the resin 47 which becomes the resin portion 9 would easily flow. As a result, it is suppressed that the electronic component 1 is increased in size while it is suppressed that resin 47 reaches positions which would cause a drop in characteristics of the SAW resonators 31 and therefore a drop of the electrical characteristics of the SAW resonators 31 can be suppressed.

The dam members 43 are provided for the plurality of electrode fingers 36*b* only in the outside regions of the regions which are positioned in the direction perpendicular to the plurality of electrode fingers 36*b* (direction of arrangement).

Accordingly, it is suppressed that the SAW which is leaked from the SAW resonators 31 to the propagation direction of the SAW (y-direction) is reflected by the dam members 43 and returned back to the SAW resonators 31. Consequently, a drop in the electrical characteristics of the SAW resonators 31 is suppressed.

As explained with reference to FIG. 5C, each dam member 43 abuts against the lateral edge portion 39*a* of the outer wiring 39. The angle θ2 which is formed by the side surface 43*a* of the dam member 43 on the opposite side to the lateral edge portion 39*a* and the lower surface 19*a* of the piezoelectric substrate 19 is larger than the angle θ1 formed by the side surface 39*aa* of the lateral edge portion 39*a* and the lower surface 19*a* of the piezoelectric substrate 19.

Accordingly, the capillary pressure on the side surface 43*a* of the dam member 43 is smaller than the capillary pressure on the side surface 39*aa* of the outer wiring 39. As a result, the flow suppression effect of the resin 47 by the dam member 43 increases.

<Second Embodiment>

Figure 7:
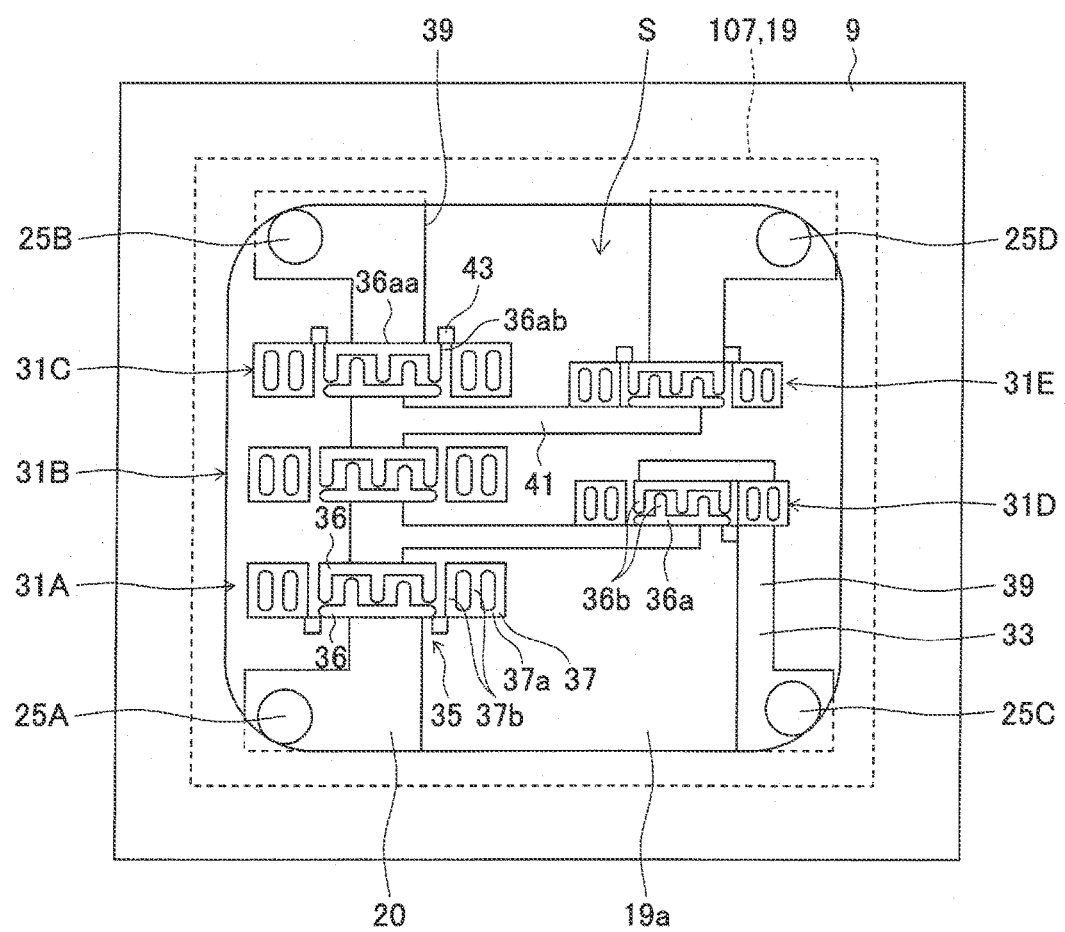
FIG. 7 A plan view which shows an electronic component according to a second embodiment of the present invention and corresponds to FIG. 4.

FIG. 7 is a plan view of an electronic component according to a second embodiment and corresponds to FIG. 4.

The second embodiment differs from the first embodiment only in the position of arrangement of the dam members 43. Specifically, this is as follows.

In a SAW element 107 of the second embodiment, the dam members 43 are adjacent to the edges of the IDTs 35 and reflectors 37 and close the gaps between the IDTs 35 and the reflectors 37 on the side where the outer wirings 39 extend outward (positive side or negative side in x-direction).

Here, when liquid-state resin 47 flows from the periphery side to the inner side of the piezoelectric substrate 19 along the lateral edge portions 39*a* of the outer wirings 39, even if the resin 47 reaches the edge portions 36*aa* on the outsides of the bus bars 36*a* (the edge portions on opposite sides to the electrode fingers 36*b*), it exerts almost no influence upon the electrical characteristics of the SAW resonators 31. However, when the resin 47 further flows along the edge portions 36*aa* and flows into the gaps between the IDTs 35 and the reflectors 37, the resin 47 becomes positioned within the range of propagation of the SAW, therefore the electrical characteristics of the SAW resonator 31 are lowered.

Accordingly, in the present embodiment, it is possible to suppress inflow of the resin 47 to the gaps by the dam members 43 and suppress the drop of electrical characteristics. Note that, regarding suppression of arrival of the resin 47 to the outsides of the reflectors 37 in the direction of propagation of the SAW (y-direction) and so on, in the same way as the first embodiment, dam members 43 contribute to lengthening the path and lowering the capillary pressure.

<Third Embodiment>

Figure 8:
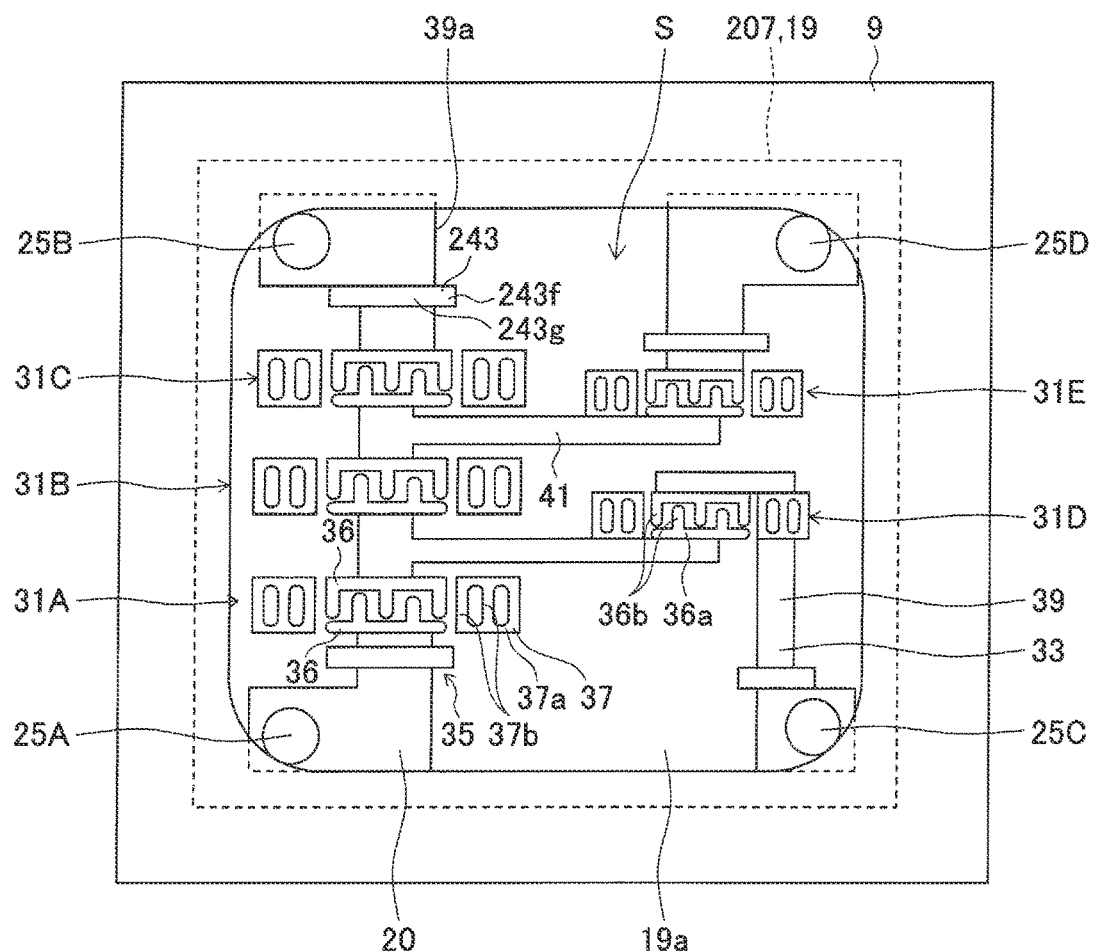
FIG. 8 A plan view which shows an electronic component according to a third embodiment of the present invention and corresponds to FIG. 4.

FIG. 8 is a plan view of an electronic component according to a third embodiment and corresponds to FIG. 4.

The third embodiment differs from the first embodiment only in the shape of the dam members. Specifically, this is as follows.

In a SAW element 207 in the third embodiment, dam members 243 cross the outer wirings 39. That is, the dam members 243 have adjacent parts 243*f* corresponding to the dam members 43 in the first embodiment and cross parts 243*g* which are connected to the adjacent parts 243*f* and cross the outer wirings 39 above the outer wirings 39.

Accordingly, the adjacent parts 243*f* can exert the same effect as that by the dam members 43 in the first embodiment. Further, the cross parts 243*g* can dam the resin 47 which wets and travels along the surfaces of the outer wirings 39 and can suppress the flow of the resin 47 more reliably. Note that, the dam members 43 in the first embodiment can be grasped to have only the adjacent parts 243*f*.

<Fourth Embodiment>

Figure 9:
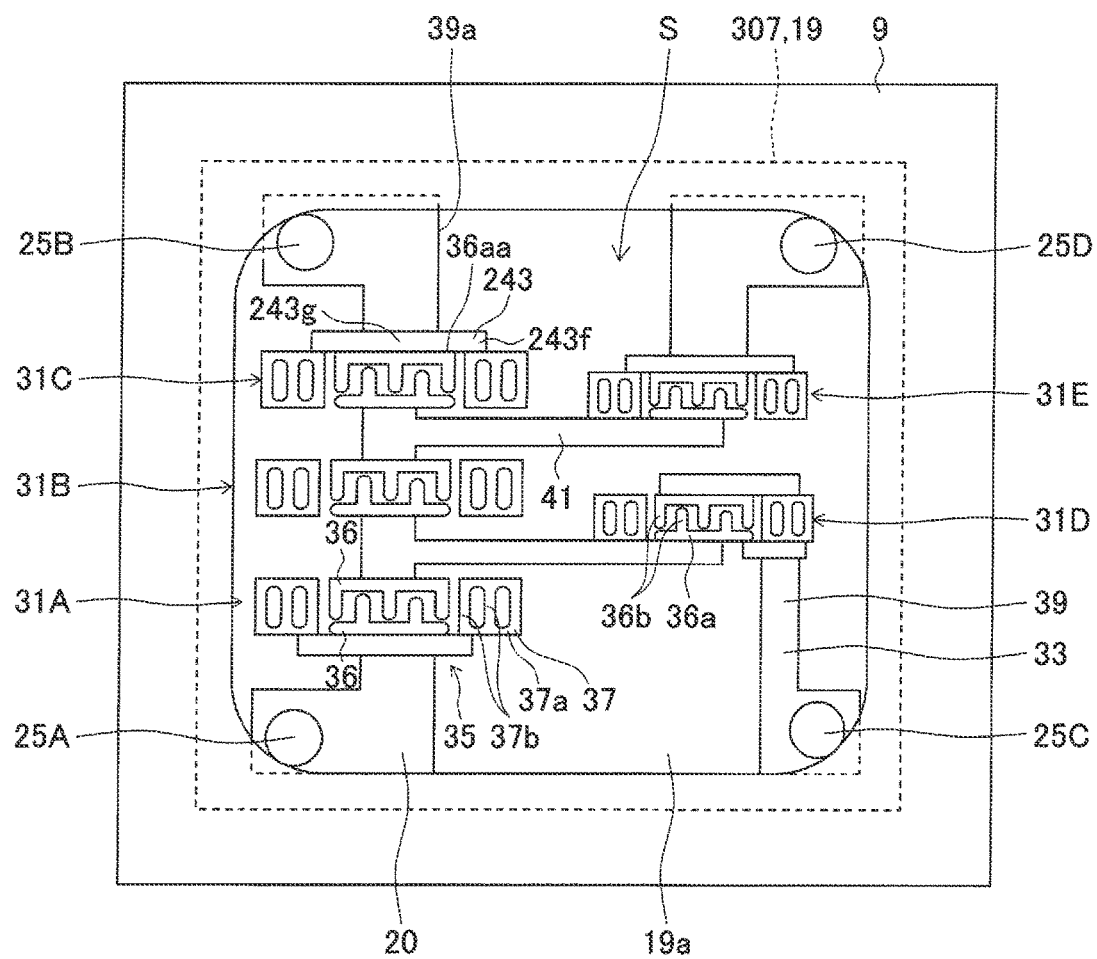
FIG. 9 A plan view which shows an electronic component according to a fourth embodiment of the present invention and corresponds to FIG. 4.

FIG. 9 is a plan view of an electronic component according to a fourth embodiment and corresponds to FIG. 4.

The fourth embodiment is a combination of the second embodiment and the third embodiment. That is, in a SAW element 307 in the fourth embodiment, dam members 243 have adjacent parts 243*f* and cross parts 243*g* in the same way as the third embodiment. Further, the adjacent parts 243*f* are formed relatively long and are not only adjacent to the edges of the outer wirings 39, but are also adjacent to the edges of the bus bars 36*a* and the edges of the reflectors 37 and consequently close the gaps between the IDTs 35 and the reflectors 37 in the same way as the second embodiment.

<Fifth Embodiment>

Figure 10:
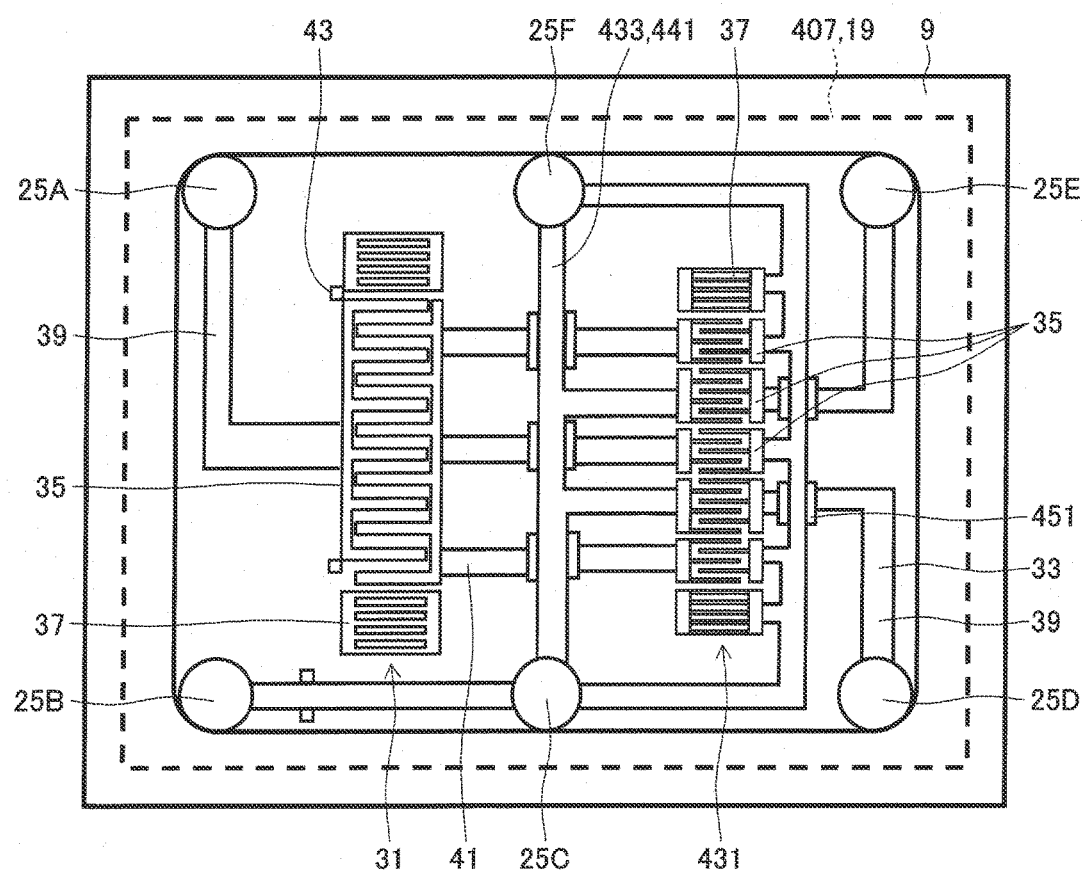
FIG. 10 A plan view which shows an electronic component according to a fifth embodiment of the present invention and corresponds to FIG. 4.

FIG. 10 is a plan view of an electronic component according to a fifth embodiment and corresponds to FIG. 4.

In the electronic component in the fifth embodiment as well, in the same way as the first embodiment, provision is made of a dam member 43 adjacent to the edge of an outer wiring 39. Here, a SAW element 407 in the fifth embodiment has insulators 451 for enabling two wirings to cross over each other. The dam member 43 is formed by the same material as the insulators 451. Specifically, this is as follows.

The SAW element 407 has a SAW resonator 31 receiving as input unbalanced signals from the element pad 25A and has a SAW filter 431 receiving as input signals output from the SAW resonator 31 and outputting balanced signals to the element pads 25D and 25E. Note that, the element pads 25B, 25C, and 25F are given the reference potential and are connected to the SAW filter 431.

The SAW resonator 31 has the same configuration as that of a SAW resonator 31 in the first embodiment. The SAW filter 431 has a plurality of (five in the present embodiment) IDTs 35 arranged in the propagation direction of the SAW and reflectors 37 arranged on the two sides of the former.

Further, the SAW element 407 has first wirings 33, insulators 451 arranged above the first wirings 33, and a second wiring 433 which is arranged above the insulators 451 and crosses over the first wirings 33.

Specifically, between the SAW resonator 31 and the SAW filter 431, three intermediate wirings 41 which connect the SAW resonator 31 and the SAW filter 431 in the first wirings 33 and the portions of the second wiring 433 which connect the element pads 25C and 25F and the SAW filter 431 cross over each other.

Further, between the SAW filter 431 and the element pads 25D and 25E, the outer wirings 39 which connect the SAW filter 431 and the element pads 25D and 25E in the first wirings 33 and the portions of the second wiring 433 which connects the element pads 25C and 25F and the SAW filter 431 cross over each other.

The first wirings 33 have the same configuration as that of the wirings 33 in the first embodiment except for the planar shape. That is, the first wirings 33 are for example formed by the same material (metal such as Al—Cu alloy) with the same thickness (for example 100 to 300 nm) as these for the SAW resonator 31 and SAW filter 431 etc.

The insulators 451 are formed by for example a resin. The resin is preferably photosensitive resin such as polyimide. The thickness of the insulators 451 is for example 0.5 μm to 3 μm.

The second wiring 433 is for example formed by metal such as gold, nickel or chromium. The second wiring 433 is for example formed thicker than the first wirings 33 so as not to be disconnected due to a difference in level caused by the insulators 451. Its thickness is for example 1 to 2 μm.

The method for producing the SAW element 407 may be the same as the method for producing the SAW element 7 in the first embodiment except for the formation of the insulators 451 and the second wiring 433.

The insulators 451 are formed by patterning the insulating layer 45 (FIG. 6B and FIG. 6C) in the same way as the dam member 43. Accordingly, the dam member 43 is formed simultaneously with the formation of the insulators 451 which are necessary for the overhead crossing, therefore an increase of manufacturing cost is suppressed.

The second wiring 433 is for example formed by forming a metal layer and patterning the metal layer in the same way as for the first wirings 33 after the formation of the insulators 451 and dam member 43. Note that, the dam members 243 in the third embodiment can be grasped as the same configuration as the insulators 451 but without a conductive layer (second wiring 433) above them.

<Sixth Embodiment>

Figure 11:
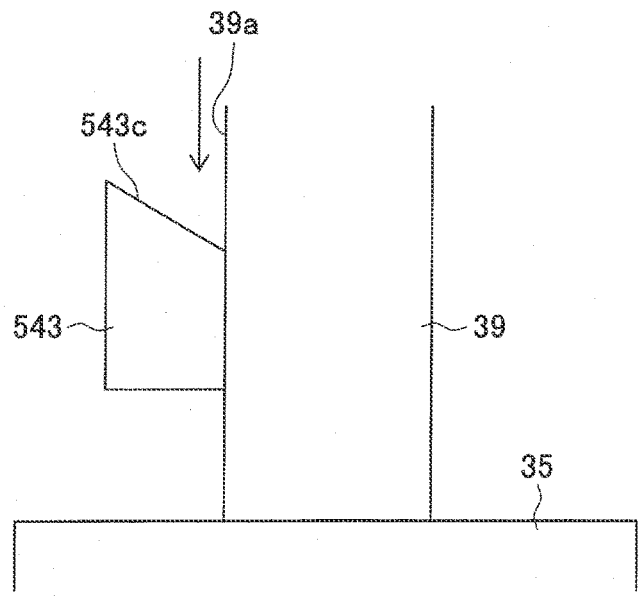
FIG. 11 A plan view which shows a dam member according to a sixth embodiment of the present invention.

FIG. 11 is a plan view which shows a dam member 543 according to a sixth embodiment.

The dam member 543 abuts against the lateral edge portion 39a of an outer wiring 39 in the same way as the first embodiment. At the upstream side in the flow of the resin 47 (the periphery side of the piezoelectric substrate 19 in the direction along the lateral edge portion 39a) other than the abutment position, the dam member 543 has an inclined edge portion 543c which is inclined relative to the lateral edge portion 39a so as to be separated from the lateral edge portion 39a the further to the upstream side. That is, the gap between the dam member 543 and the lateral edge portion 39a becomes broader the further to the upstream side of the flow. Note that, the inclined edge portion 543c may be straight or may be curved.

When the resin 47 which flows through the groove which is formed by the side surface 39aa of the lateral edge portion 39a and the lower surface 19a of the piezoelectric substrate 19 (FIG. 5B) due to capillary pressure reaches the inclined edge portion 543c, it tries to flow along the inclined edge portion 543c by the capillary pressure in the groove formed by the side surface of the inclined edge portion 543c and the lower surface 19a. At this time, the resin 47 is still pulled to the groove formed by the lateral edge portion 39a and the lower surface 19a, therefore force is applied to the resin 47 so as to spread over the lateral edge portion 39a and the inclined edge portion 543c. As a result, the flow of the resin 47 along the inclined edge portion 543c is prevented, therefore the flow of the resin 47 can be suppressed.

Note that, the angle formed by the inclined edge portion 543c and the lateral edge portion 39a when viewed as a plane may be suitably set within a range exceeding 0° and less than 90°. Further, in the inclined edge portion 543c as well, as explained with reference to FIG. 5C, the angle θ2 may be made large so that the capillary pressure in the groove formed by the dam member 543 and the lower surface 19a of the piezoelectric substrate 19 becomes small. The dam member 543 may be formed by the same material and same process as for the outer wirings 39 or may be formed by an insulating material.

<Seventh Embodiment>

Figure 12:
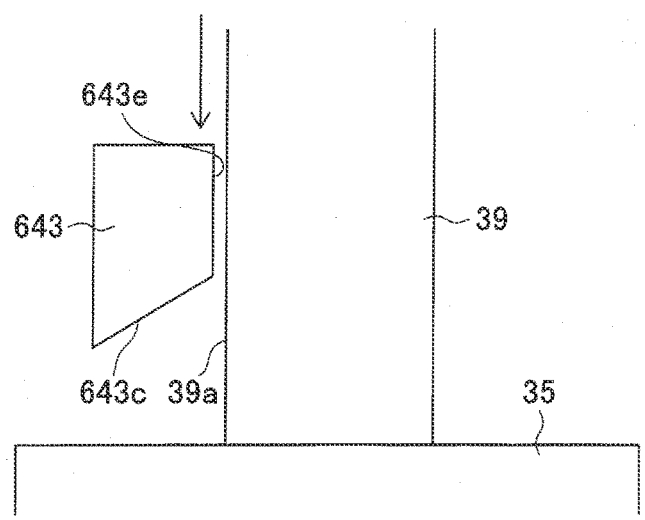
FIG. 12 A plan view which shows a dam member according to a seventh embodiment of the present invention.

FIG. 12 is a plan view which shows a dam member 643 according to a seventh embodiment.

In the dam member 643, unlike the other embodiments, an adjacent edge 643e is adjacent to the lateral edge portion 39a of an outer wiring 39 through a relatively fine gap. Note that, this gap may be intentionally formed or may be formed due to an error of patterning.

The size of the gap between the adjacent edge 643e and the lateral edge portion 39a is for example set to about the same extent as the thickness of the outer wiring 39 (first wiring 33) so that the resin 47 which flows in the groove formed by the side surface 39aa of the lateral edge portion 39a and the lower surface 19a of the piezoelectric substrate 19 contacts the adjacent edge 643e as well. This is for example 0.1 μm to 0.3 μm.

Further, the dam member 643 has an inclined edge portion 643c on the downstream side of the adjacent edge 643e (IDT 35 side) which is inclined relative to the lateral edge portion 39a so as to be separated more from the lateral edge portion 39a the further to the downstream side. That is, the gap between the dam member 643 and the lateral edge portion 39a becomes broader the further to the downstream side of the flow of the resin 47. Note that, the inclined edge portion 643c may be straight or may be curved.

When the resin 47 flows in the gap formed by the adjacent edge 643e and the lateral edge portion 39a and reaches the inclined edge portion 643c, the resin 47 not only flows along the lateral edge portion 39a, but also tries to flow along the inclined edge portion 643c due to the capillary pressure in the groove formed by the inclined edge portion 643c and the lower surface 19a of the piezoelectric substrate 19. Accordingly, by extension of the inclined edge portion 643c so as to separate from the lateral edge portion 39a, the resin 47 becomes subject to capillary pressure so that it spreads over the lateral edge portion 39a and the inclined edge portion 643c. As a result, the flow of the resin 47 along the lateral edge portion 39a is prevented, therefore the flow of the resin 47 can be suppressed.

Note that, the angle formed by the inclined edge portion 643c and the lateral edge portion 39a when viewed as a plane may be suitably set within a range exceeding 0° to less than 90°. Further, in the inclined edge portion 643c, θ2 (FIG. 5C) may be set relatively small (for example 90 degrees or less) so that the capillary pressure pulling on the resin 47 becomes large.

The dam member 643 may be formed by the same material and same process as those for the outer wiring 39 or may be formed by an insulating material. In the present embodiment, the dam member 643 and the outer wiring 39 do not abut against each other. Therefore, even when the dam member 643 is formed by an electrically conductive material, compared with the other embodiments, the influence of the dam member 643 exerted upon impedance etc. of the element conductive layer including the outer wiring 39 is small, therefore the impedance etc. can be matched with the design value with a high accuracy.

<Eighth Embodiment>

Figure 13:
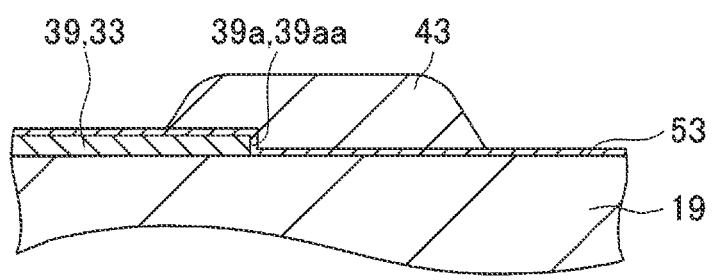
FIG. 13 A cross-sectional view which shows an electronic component according to an eighth embodiment of the present invention and corresponds to FIG. 5C.
Figure 13:
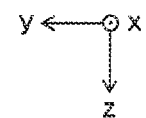

FIG. 13 is a cross-sectional view which shows an electronic component according to an eighth embodiment and corresponds to FIG. 5C.

The electronic component in the eighth embodiment differs from the first embodiment only in the point that provision is made of a protective layer 53 covering the element conductive layer 20

The protective layer 53 contributes to prevention of oxidation etc. of the element conductive layer 20. The protective layer 53 is for example provided over roughly the entire surface of the lower surface 19a of the piezoelectric substrate 19 and covers the SAW resonators 31 and wirings 33, but exposes the element pads 25. The protective layer 53 is made of an insulating material. The insulating material is for example silicon oxide ($SiO_2$ etc.), aluminum oxide, zinc oxide, titanium oxide, silicon nitride, or silicon. The thickness of the protective layer 53 is for example about 1/10 (10 to 30 nm) of the thickness of the element conductive layer 20.

Even in the case where the protective layer 53 is provided, a step difference occurs due to the wirings 33, therefore the resin 47 flows due to capillary pressure of this step difference. Accordingly, in the eighth embodiment as well, by providing dam members 43 adjacent to the lateral edge portions 39a of the outer wirings 39 through the protective layer 53, the effect of suppressing the flow of the resin 47 is obtained.

Note that, in the above first to eighth embodiments, the SAW element 7 etc. are examples of the electronic element in the present invention, the resin portion 9 is one example of the sealing resin in the present invention, the piezoelectric substrate 19 is one example of the element board in the present invention, the IDT 35 (or comb-shaped electrode 36) or reflector 37 is one example of the functional member and crossed electrode in the present invention, and the dam member 43 etc. are examples of the flow suppression part in the present invention. The side surface 39aa etc. of the wiring 33 in the first embodiment and the wall surface of the step difference appearing on the protective layer 53 in the eighth embodiment are one example of the wall surfaces of the step differences formed due to the wirings etc. in the present invention.

<Ninth Embodiment>

Figure 14:
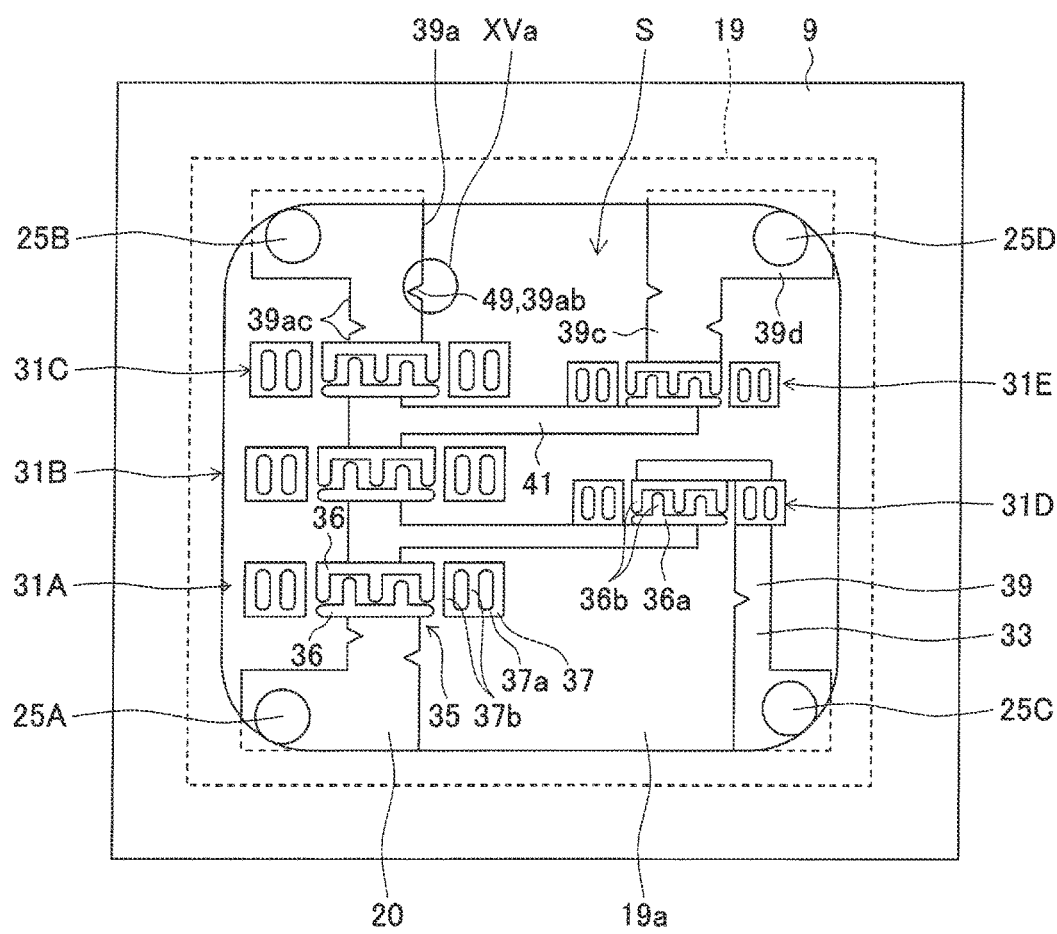
FIG. 14 A plan view which shows an electronic component according to a ninth embodiment of the present invention and corresponds to FIG. 4.

FIG. 14 is a plan view which shows an electronic component according to a ninth embodiment and corresponds to FIG. 4.

In the first to eighth embodiments, as the flow suppression parts against the liquid-state resin 47, provision was made of the dam members 43 which have portions adjacent to the wirings 33. Contrary to this, in the ninth embodiment, as the flow suppression parts, provision is made of concave portions 49 formed in the wirings 33. Specifically, this is as follows.

The outer wirings 39, for example, when ignoring the concave portions 49, include linear portions which have constant widths in the same way as the first embodiment. Specifically, for example, the outer wirings 39 include first portions 39c which linearly extend from the bus bars 36a (or bus bars 37a) in a direction perpendicular to the bus bars 36a with constant widths and include second portions 39d which linearly extend from the lateral sides of the first portions 39c in a direction perpendicular to the first portions 39c with constant widths larger than those of the first portions 39c and are formed in roughly L-shapes.

The concave portions 49 are formed at the lateral sides of the outer wirings 39 (first portions 39c). Due to the formation of the concave portions 49, compared with a case assuming no concave portions 49 are formed, the lateral edge portions 39a of the outer wirings 39 become longer. Note that, in the following description, at the lateral edge portions 39a, portions which form the front and back of the concave portions 49 in the direction of extension of the outer wirings 39 will be referred to as "standard edge portions 39ac" and portions in the concave portions 49 will be referred to as "pattern-forming edge portions 39ab". In the present embodiment, the standard edge portions 39ac extend straight.

The shapes and sizes of the concave portions 49 may be suitably set. For example, in the present embodiment, the shapes of the concave portions 49 are triangular. Further, for example, the depths of the concave portions 49 from the standard edge portions 39ac are set to less than a half of the width of the portions of the outer wirings 39 which form the front and back of the concave portions 49 in the direction of extension of the outer wirings 39 (or the width when assuming that concave portions 49 are not formed).

The method for producing the electronic component in the present embodiment is roughly the same as the method for producing the electronic component in the first embodiment. However, formation of the dam members 43 (FIG. 6B and FIG. 6C) is not executed. Instead, the concave portions 49 are formed in the formation of the element conductive layer 20 (FIG. 6A).

Figure 15A:
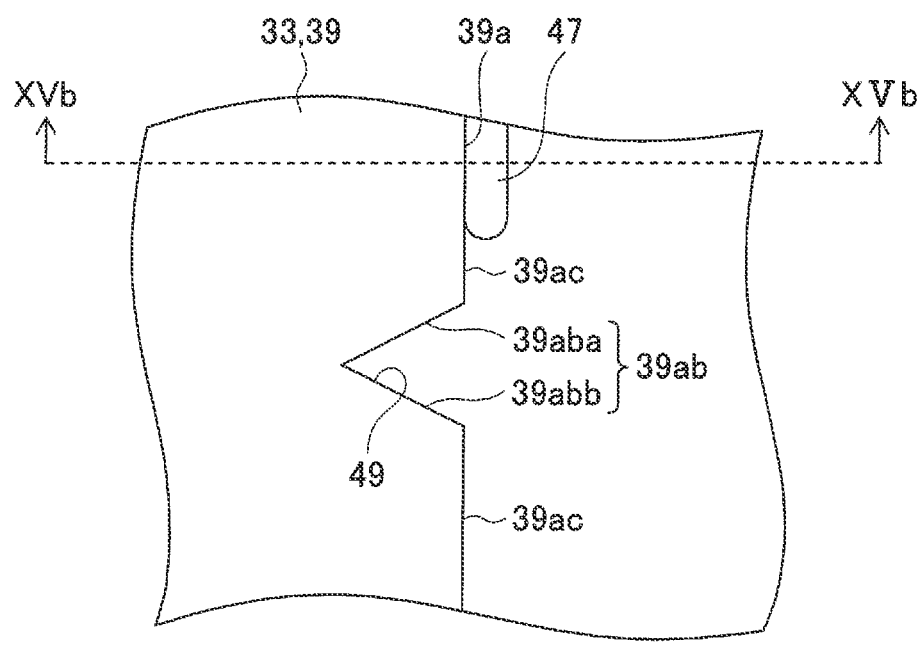
Figure 15B:
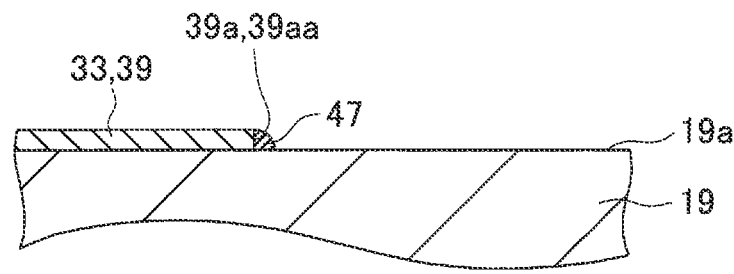
FIG. 15B is a cross-sectional view taken along a line XVb-XVb in FIG. 15A.

FIG. 15A is an enlarged view of a region XVa in FIG. 14, while FIG. 15B is a cross-sectional view taken along a line XVb-XVb in FIG. 15A.

As explained in the explanation of the first embodiment, in the process of supplying the liquid-state resin 47 shown in FIG. 6E, as shown in FIG. 15A and FIG. 15B, a portion of the resin 47 is likely to flow to the space S side along the lateral edge portion 39a of the outer wiring 39.

However, due to the formation of the concave portion 49, the route (lateral edge portion 39a) over which the liquid-state resin 47 flows is longer than that in the case of assuming that a concave portion 49 is not formed. That is, the flow along the direction of extension of the wiring 33 is suppressed. Accordingly, the arrival of the resin 47 to the SAW resonator 31 is suppressed and consequently the drop of electrical characteristics of the SAW resonator 31 due to the resin 47 is suppressed. It is possible to make the lateral edge portion 39a longer by extension of the wiring 33 itself by bending the wiring 33 itself. However, compared with this method, in the method of providing the concave portion 49, the region of arrangement of the wiring 33 is reduced. Further, reduced increase of impedance is expected as well.

The concave portion 49 is formed in a triangle, therefore the pattern-forming edge portion 39ab in the concave portion 49 has a first edge part 39aba (FIG. 15A) and a second edge part 39abb (FIG. 15A) which is positioned nearer the SAW resonator 31 side than the first edge part 39aba and intersects with the first edge part 39aba. Further, an angle formed by the first edge part 39aba and second edge part 39abb is relatively small (for example less than 90°).

Accordingly, when flowing along the first edge part 39aba and reaching the corner portion formed by the first edge part 39aba and second edge part 39abb, the liquid-state resin 47 is pulled into the groove which formed by the second edge part 39abb and tries to advance to the SAW resonator 31 side while is still pulled into the groove formed by the first edge part 39aba. Therefore, the resin 47 is subjected to a force so that it spreads over the first edge part 39aba and second edge part 39abb. As a result, the flow of the resin 47 to the SAW resonator 31 side along the second edge part 39abb is prevented, therefore suppression of the flow of the resin 47 is expected.

As shown in FIG. 14, in the outer wirings 39 which are connected to the IDTs 35 (the outer wirings 39 which correspond to the element pads 25A, 25B, and 25D), the concave portions 49 are provided on the two lateral sides. The two concave portions 49 which are provided on the two lateral sides are different in the position in the direction of extension of the outer wirings 39 from each other. In more detail, the two concave portions 49 are provided so as not to overlap each other when viewed in a direction perpendicular to the outer wirings 39.

Accordingly, on the two lateral sides of the wirings 33, the inflow of the resin can be suppressed. On the other hand, narrowing of the cross-sectional area of the wirings 33 is suppressed compared with the case where the concave portions 49 provided on the two lateral sides are provided at the same positions as each other in the direction of extension of the wirings 33.

Note that, at one outer wiring 39 connected to a reflector 37 (the outer wiring 39 corresponding to the element pad 25C), the concave portion 49 is provided on only the lateral side which becomes the IDT 35 side at the connection position with the reflector 37.

This is done in consideration of the fact that when the resin which becomes the resin portion 9 flows to the outside of the reflector 37, the deterioration of characteristics of the SAW element 7 is smaller compared with the case where the resin which becomes the resin portion 9 flows into a gap between the IDT 35 and the reflector 37 and the fact that it is preferable that the reduction of the cross-sectional area of the wiring 33 is suppressed. However, the concave portions 49 may be provided on the two lateral sides at the outer wiring 39 which is connected to the reflector 37 as well.

FIG. 16A to FIG. 16H are plan views which show modifications according to the ninth embodiment. Note that, in the explanation of these figures, the lower parts in the drawings are defined as the sides where the wirings 33 are connected to the SAW resonators 31, while the upper parts in the drawings are defined as the periphery sides of the piezoelectric substrate 19.

In the embodiment, the concave portion 49 was given a triangular shape. However, the concave portion has the effect of suppressing the inflow of the liquid-state resin 47 by making the lateral edge portion 39a of the wiring 33 long even in a case where it has a shape other than a triangle. Further, even if a convex portion is provided in place of a concave portion, the lateral edge portion 39a becomes long, therefore the effect of suppressing the inflow of the liquid-state resin 47 is exhibited. Therefore, FIG. 16A to FIG. 16H show modifications of the relief portion including at least one of such convex portion and concave portion.

Figure 16A:
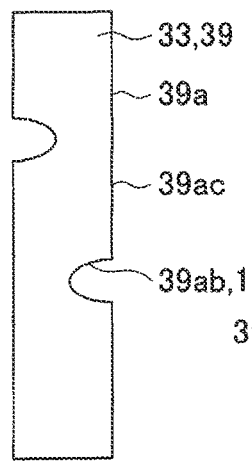
FIG. 16A to FIG. 16H are plan views which show various modifications according to the ninth embodiment.

In FIG. 16A, a concave portion 149 is shaped as a halved ellipse. In this way, the pattern-forming edge portion 39ab may be formed in a curved shape. Note that, the concave portion 149 can be grasped as the concave portion 49 in the embodiment with corner portions which are chamfered or with two sides which are formed in curved shapes. Note that, also the intersecting portions of the standard edge portions 39ac and the pattern-forming edge portion 39ab may be chamfered.

Figure 16B:
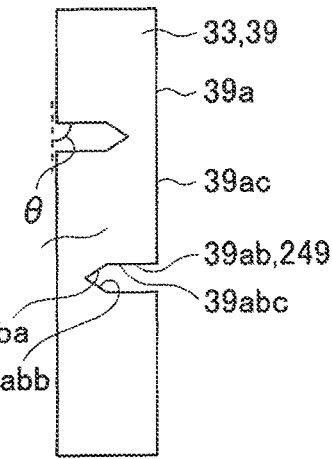

In FIG. 16B, a concave portion 249 is formed in pentagon shape. In this way, the concave portion may be formed in a shape having four or more sides as well. Note that, the concave portion 249 includes, in its deepest portion, a concave portion configured by a first edge part 39aba and a second edge part 39abb which intersects with the first edge part 39aba by an angle less than 90°. Therefore, in the deepest portion of the concave portion 249, an effect the same as the effect in the intersecting portion of the first edge part 39aba and second edge part 39abb in the concave portion 49 is exhibited.

Further, in FIG. 16B, the lateral edge portion 39a of the wiring 33 extends so that, when arriving at the concave portion 249 from the periphery side of the piezoelectric substrate 19, it turns at an angle θ of 90° relative to the direction of advance up to then. In other words, the pattern-forming edge portion 39ab includes a third edge part 39abc which is perpendicular to the standard edge portion 39ac.

Accordingly, due to provision of the third edge part 39abc which does not extend in the direction along the standard edge portion 39ac (inflowing direction of the liquid-state resin 47), the lateral edge portion 39a is easy to be efficiently made long relative to the size etc. of the concave portion. Further, the intersecting portion of the standard edge portion 39ac and the third edge part 39abc approaches the state where the groove is ended midway compared with the case where it turns at an angle less than 90°, therefore the capillary pressure is lowered. From the above description, effective suppression of inflow of the resin 47 is expected.

Note that, even in the case of a shape that has four or more sides or a concave portion at which the lateral edge portion 39a turns at an angle of 90°, in the same way as FIG. 16A, the corner portion may be chamfered or at least a portion of the side may be curved. The change of direction at 90° may be gradually achieved by a curve as well.

Figure 16C:
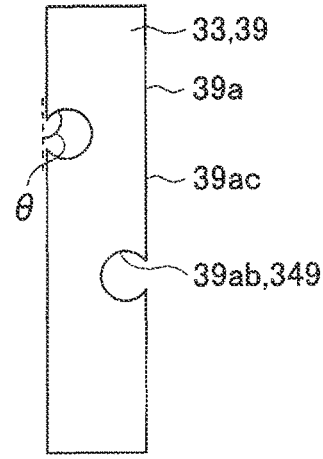

In FIG. 16C, the lateral edge portion 39a of the wiring 33 extends so as to turn at an angle θ exceeding 90° relative to the direction of advance up to then when reaching a concave portion 349 from the periphery side of the piezoelectric substrate 19.

When the angle θ exceeds 90° in this way, an effect the same as the effect by the angle θ being 90° as explained with reference to FIG. 16B is exhibited more conspicuously. Specifically, first, by the pattern-forming edge portion 39ab including an edge part which extends in an inverse direction to the direction along the standard edge portion 39ac (inflowing direction of the liquid-state resin 47), the lateral edge portion 39a is easy to be efficiently made long relative to the size etc. of the concave portion. Further, the intersecting portion of the standard edge portion 39ac and pattern-forming edge portion 39ab approaches the state where the groove is ended midway compared with the case where it turns at an angle less than 90°, therefore the capillary pressure falls.

Note that, even in the case where the lateral edge portion 39a turns at an angle θ exceeding 90° in this way, the concave portion 349 may be formed in polygonal shape like the concave portion 49 in the embodiment or the concave portion 249 in FIG. 16B (the pattern-forming edge portion 39ab may be straight in shape).

Figure 16D:
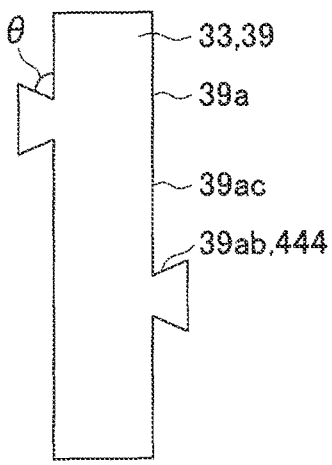

In FIG. 16D, a convex portion 444 is provided in place of the concave portion. As explained above, at the convex portion 444 as well, the lateral edge portion 39a of the wiring 33 becomes longer, therefore the effect of suppression of inflow of the liquid-state resin 47 is exhibited.

Further, in FIG. 16D, in the same way as FIG. 16C, the lateral edge portion 39a of the wiring 33 extends so as to turn at an angle θ exceeding 90° relative to the direction of advance up to then when arriving at the convex portion 444 from the periphery side of the piezoelectric substrate 19 (the angle θ may be 90° as well in the same way as FIG. 16B).

Accordingly, first, in the same way as FIG. 16B and FIG. 16C, by the pattern-forming edge portion 30ab including an edge part which extends in an inverse direction to the direction along the standard edge portion 39ac (inflowing direction of the liquid-state resin 47), the lateral edge portion 39a is easy to be efficiently made long relative to the size etc. of the convex portion. Further, the intersecting portion of the standard edge portion 39ac and pattern-forming edge portion 39ab acts to spread the resin 47 in the same way as the intersecting portion of the first edge part 39aba and second edge part 39abb in the concave portion 49 in the embodiment. From the above description, effective suppression of inflow of the resin 47 is expected.

Note that, in the same way as the embodiment and FIG. 16A, the convex portion may have an angle θ less than 90° or may be formed in a suitable polygonal shape such as a triangular or a pentagonal shape in the same way as the embodiment and FIG. 16B or the pattern-forming edge portion 39ab may be curved in the same way as FIG. 16A and FIG. 16C.

Figure 16E:
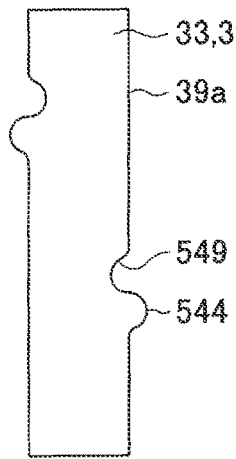

In FIG. 16E, a concave portion 549 and a convex portion 544 are successively formed along the direction of extension of the wiring 33. In this way, a concave portion and a convex portion may be successively provided. Note that, a concave portion and a concave portion may be successively provided, a convex portion and a convex portion may be successively provided, or three or more concave portions or convex portions may be successively provided. The concave portion and the convex portion may be given various types of shapes as shown in FIG. 16A to FIG. 16D.

Figure 16F:
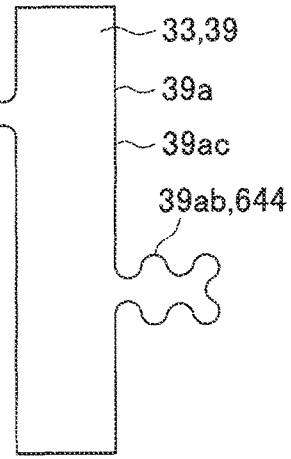

In FIG. 16F, relief shapes are further formed in the pattern-forming edge portion 39ab of a convex portion 644. In this case, the lateral edge portion 39a becomes further long. Note that, in the same way, relief shapes may be formed in a concave portion in place of a convex portion as well. The shape and size of the relief shapes may be suitably determined.

Figure 16G:
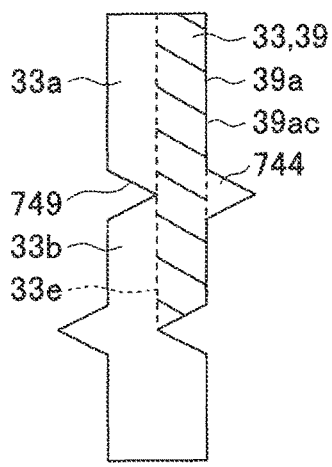

In FIG. 16G, at the same positions in the direction of extension of the wiring 33, a concave portion 749 is formed on one lateral side, and a convex portion 744 is formed on the other lateral side. The concave portion 749 and convex portion 744 are preferably given shapes and sizes which complement each other. Note that, the concave portion and convex portion may be given various types of shapes as shown in the embodiment and FIG. 16A to FIG. 16F.

The concave portion 749 and convex portion 744, in the same way as the concave portions and convex portion which have been already explained, make the lateral edge portion 39a longer and suppress inflow of the liquid-state resin 47 compared with the case where the concave portion 749 and convex portion 744 are not provided. Further, since the concave portion 749 and the convex portion 744 are arranged sandwiching the wiring 33 therebetween, change of the width of the wiring 33 is suppressed.

Note that, the wiring 33 shown in FIG. 16G has a first wiring portion 33a and second wiring portion 33b which extend at the front and back of the concave portion 749 and the convex portion 744 in the same direction and has a transition area 33e (region indicated by hatching) having a constant width which extends across the first wiring portion 33a to the second wiring portion 33b parallel to these and passes the positions of arrangement of the concave portion 749 and convex portion 744. Accordingly, the part of the wiring 33 which is provided with the concave portion 749 and convex portion 744 is differentiated from a bent part of the wiring 33 itself. Note that, when further strictly differentiating the part of the wiring 33 which is provided with the concave portion 749 and convex portion 744 from a bent part of the wiring 33 itself, the depth of the concave portion 749 and the amount of projection of the convex portion 744 are not more than a half or ⅓ of those of the first wiring portion 33a and second wiring portion 33b. In the wirings 33 shown in FIG. 16A to FIG. 16F, the widths of the wirings 33 are made narrower or broader due to the concave portions or convex portions. They are clearly differentiated from a bent part of the wiring 33 itself.

Figure 16H:
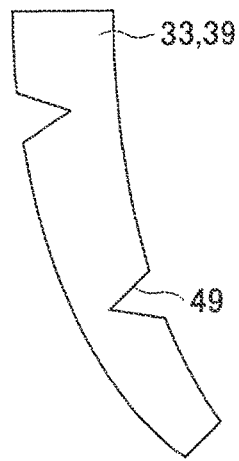

In FIG. 16H, the wiring 33 extends in a curved shape and changes in the width in the extension direction. In such an wiring 33 as well, a concave portion or convex portion as exemplified in FIG. 16A to FIG. 16G may be provided.

The present invention is not limited to the above embodiments and may be worked in various ways.

The first to ninth embodiments and the modifications according to the ninth embodiment may be suitably combined. For example, in the fifth embodiment, as the dam member comprised of the same material as for the insulator for realizing the 3D wiring, a dam member which crosses the wiring as in the third or fourth embodiment may be provided. The shape of the dam member in the sixth embodiment (the inclined edge portion on the upstream side of the flow) may be applied to the dam members in the first to fourth embodiments, the shape of the dam member in the seventh embodiment (the inclined edge portion on the downstream side of the flow) may be applied to the dam members in the first and second embodiments, the protective layer in the eighth embodiment may be provided in any of the second to seventh embodiments, and the dam members in the first to eighth embodiments and the relief portions in the ninth embodiment and its modifications may be provided together.

Further, for example, even in a case where the flow suppression part is the relief portion, in the same way as the eighth embodiment, the wiring and functional member may be covered by an insulating protective layer which contributes to prevention of oxidation etc. of them, and the protective layer may be exposed to the space. Even in this case, the flow along the step difference which is formed on the surface of the protective layer due to the thickness of the wiring can be suppressed by the relief portion formed on the lateral side of the wiring (relief portion formed on the surface of the protective layer corresponding to the relief portion of the wiring).

The electronic component is not limited to the SAW device. In other words, the electronic element is not limited to a SAW element (the functional member is not limited to a crossing electrode). The electronic element may be one not utilizing an acoustic wave or may be one utilizing an acoustic wave other than a SAW such as a film bulk acoustic resonator.

The support member is not limited to one interposed between the electronic element and the mounting board. For example, the support member may be one functioning as a mother board (main board) of an electronic apparatus such as a mobile phone as well. Further, the support member may be one on which a plurality of electronic elements are mounted as well.

The functional member may be one formed by a conductor or may be one formed by a semiconductor. In the case where the functional member is a crossing electrode, the crossing electrode may be an IDT or reflector as exemplified FIG. 4 and FIG. 7 etc.

The flow suppression part is not limited to a dam member or relief portion of an wiring. For example, the flow suppression part may be configured by coating a material having a low wettability with a liquid-state resin on the lower surface of the element board very thinly or may be configured by formation of a relief portion when viewed as a cross-section on the protective layer covering the wiring and so on. In either case, by providing a flow suppression part so that at least a portion is arranged at the edge portion of the wiring etc. or at a position adjacent to that and so that it becomes local relative to the circumferential direction surrounding the functional member, for example, the effect that the flow can be efficiently controlled etc. is exhibited compared with the case of provision of a dam that surrounds the functional member over the entire circumference and so on.

The adjacent part of the dam member may be adjacent to the edge of an wiring as exemplified in FIG. 4 etc. or may be adjacent to the edge of a functional member as exemplified in FIG. 7 etc. The adjacent part may be arranged at a suitable position in accordance with the configuration etc. of the functional member or other various circumstances where it is adjacent to the edge of the functional member. For example, preferably the adjacent part is positioned nearer the wiring side than the position at which the drop of electrical characteristics of the functional member becomes relatively large when the sealing resin reaches it. Alternatively, preferably the adjacent part is adjacent to the edge portion of the functional member to which the wiring is connected (for example the edge portion 36aa in FIG. 7) or adjacent to the edge portion with which the former edge portion intersects (for example the edge portion 36ab intersecting the edge portion 36aa in FIG. 7) so as to suppress the sealing resin which tries to surround the functional member (preferably, in the functional member, the edge portion on the opposite side to the wiring is avoided).

Note that, in the case where the functional member is a crossing electrode, to prevent the inflowing sealing resin from being positioned in the propagation direction of the acoustic wave relative to the electrode fingers of the crossing electrode, preferably the adjacent part is adjacent to at least one of the lateral edge portion of the wiring, the edge portion of the bus bars which is on the opposite side to the electrode fingers and the edge portion of the bus bars intersecting with the edge portion described before (preferably, the edge portion of the bus bars which is located on the electrode fingers side and the edge portions of the electrode fingers are avoided).

As exemplified in FIG. 11 and FIG. 12, in the case where the width of the gap between a dam member and the edge portion of an wiring or a functional member changes, a change of the gap is not limited to one due to a change of the shape of the dam member, but may be one due to a change of the shape of the edge portion of the wiring or functional member (curving, bending, etc.).

The wiring at which the flow of sealing resin is suppressed by a flow suppression part (dam member, relief portion, etc.) is not limited to the outer wiring for connecting the functional member and the element pads and may be for example an intermediate wiring for connecting two or more functional members to each other. As already explained, even when an intermediate wiring, according to arrangement of a plurality of functional members etc., there is possibility that the wiring will extend from a plurality of functional members toward the periphery side of the element board and lead the sealing resin to the functional members.

The flow suppression part functions as a fail safe when the sealing resin flows along the wiring and does not always have to contact the sealing resin in the finished product. Further, the wiring does not always have to contact the sealing resin either. Further, the inner wall surface (9a) of the sealing resin may be positioned on the outer side than the side surface (19c) of the element board as well.

The sealing resin is not limited to one formed by supplying a liquid-state resin onto the electronic element. For example, it may be one formed by coating a sheet-shaped resin on an electronic element, then curing it. Even in this case, in the process of curing the sheet-shaped resin, the resin is liable to melt once and partially flow along the wiring, therefore the flow suppression part effectively functions.

REFERENCE SIGNS LIST

1 . . . electronic component, 5 . . . support member, S . . . space, 7 . . . SAW element (electronic element), 9 . . . resin portion (sealing resin), 19 . . . piezoelectric substrate (element board), 19a . . . lower surface, 33 . . . first wiring, 36 . . . comb-shaped electrode (functional member), 39 . . . outer wiring, 39a . . . lateral edge portion, 39aa . . . side surface (wall surface of step difference), and 43 . . . dam member (flow suppression part, adjacent part).

The invention claimed is:

1. An electronic component comprising:
   a support member,
   an electronic element which is mounted on the support member with a space therebetween and which has a facing surface which faces the support member, and
   a sealing resin which covers the electronic element and which is provided so as to seal the space, wherein
   the electronic element comprises
      an element board,
      a functional member provided on the facing surface of the element board,
      a first wiring which is provided on the facing surface of the element board and extends from the functional member toward the periphery side of the element board, and
      a flow suppression part against a liquid-state resin, which includes a portion positioned at least at one of an edge of the first wiring, an edge of the functional member, and a position adjacent to these edges and which is provided locally relative to the circumferential direction which surrounds the functional member, wherein the flow suppression part does not surround the functional member.

2. An electronic component as set forth in claim 1, wherein the flow suppression part is a dam member which is adjacent to at least one of the edge of the first wiring and the edge of the functional member or which projects from at least one of them.

3. An electronic component as set forth in claim 1, wherein the flow suppression part is at least one of a concave portion and a convex portion when viewed as a plane which is formed on the edge of the first wiring.

4. An electronic component as set forth in claim 2, wherein:
the element board is a piezoelectric substrate, and
the functional member is a first crossing electrode which comprises a bus bar to which the first wiring is connected and a plurality of electrode fingers which extend from the bus bar to the opposite side to the first wiring, and
the dam member is adjacent to at least one of a lateral edge of the first wiring, an edge of the bus bar to which the first wiring is connected, and an edge of the bus bar intersecting with the edge of the bus bar to which the first wiring is connected or projects from at least one of the edges.

5. An electronic component as set forth in claim 4, wherein:
the electronic element further comprises a second crossing electrode, which is provided on the facing surface of the piezoelectric substrate, comprises a second bus bar and a plurality of second electrode fingers which extend from the second bus bar in a direction that the plurality of electrode fingers of the first crossing electrode extend from the bus bar of the first crossing electrode, and is adjacent to the first crossing electrode through a gap in a direction perpendicular to the plurality of electrode fingers, and
the dam member closes the gap on the first wiring side.

6. An electronic component as set forth in claim 4, wherein the dam member is provided only in an outer region outside a first region in a first direction that the plurality of electrode fingers extend, the first region being outside the plurality of electrode fingers in a second direction perpendicular to the plurality of electrode fingers.

7. An electronic component as set forth in claim 2, wherein the dam member does not cross the first wiring.

8. An electronic component as set forth in claim 2, wherein the dam member includes an insulating crossing part which crosses the first wiring above the first wiring and on which a conductive layer is not superimposed.

9. An electronic component as set forth in claim 2, further comprising:
an insulator which is arranged on the first wiring and
a second wiring which is arranged on the insulator and intersects the first wiring in a 3D manner, wherein
the dam member is comprised of the same material as for the insulator.

10. An electronic component as set forth in claim 2, wherein:
the dam member abuts against a wall surface of a step difference formed by adjacent edges, and
an angle which is formed by the side surface of the dam member on the opposite side to the step difference and the facing surface of the element board and which is in a groove comprised of the two surfaces is larger than an angle which is formed by the wall surface of the step difference and the facing surface of the element board and which is in a groove comprised of the two surfaces.

11. An electronic component as set forth in claim 2, wherein the dam member abuts against the wall surface of the step difference formed by the adjacent edges, and comprises an edge portion which extends from that abutting position toward the periphery side of the element board in the direction along the edge configuring the step difference with an inclination relative to the edges configuring the step difference so as to be separated from the edges configuring the step difference.

12. An electronic component as set forth in claim 2, wherein:
the dam member is adjacent to the wall surface of the step difference formed by the adjacent edges through a gap, and
the gap has a part which expands more at the position on the side nearer to the functional member in the direction along the edge configuring the step difference.

13. An electronic component as set forth in claim 3, wherein the edge of the first wiring extends so as to turn at an angle not less than 90° relative to the direction of advance up to then when reaching at least one of the concave portion and the convex portion from the periphery side of the element board.

14. An electronic component as set forth in claim 3, wherein at least one of the concave portion and the convex portion includes a concave portion comprised of a first edge portion and a second edge portion which intersects with the first edge portion at an angle less than 90°.

15. An electronic component as set forth in claim 3, wherein the first wiring becomes narrower by the concave portion or broader by the convex portion.

16. An electronic component as set forth in claim 15, wherein at least one of the concave portion and the convex portion is provided as two or more parts on the lateral two sides of the first wiring so that their positions in the direction of extension of the first wiring are different from each other.

17. An electronic component as set forth in claim 3, comprising, on the lateral two sides of the first wiring, either of a pair of concave portions, a pair of convex portions, or a pair of a concave portion and convex portion which are provided at the same positions as each other in the direction of extension of the first wiring.

18. An electronic component as set forth in claim 4, wherein the dam member does not cross the first wiring.

19. An electronic component as set forth in claim 4, wherein the dam member includes an insulating crossing part which crosses the first wiring above the first wiring and on which a conductive layer is not superimposed.

20. An electronic component as set forth in claim 4, wherein:
the dam member abuts against a wall surface of a step difference formed by adjacent edges, and
an angle which is formed by the side surface of the dam member on the opposite side to the step difference and the facing surface of the element board and which is in a groove comprised of the two surfaces is larger than an angle which is formed by the wall surface of the step difference and the facing surface of the element board and which is in a groove comprised of the two surfaces.

* * * * *